US012757369B2

(12) United States Patent
Liaw

(10) Patent No.: US 12,757,369 B2
(45) Date of Patent: *Oct. 6, 2026

(54) SEMICONDUCTOR DEVICE

(71) Applicant: TAIWAN SEMICONDUCTOR MANUFACTURING COMPANY, LTD., Hsinchu (TW)

(72) Inventor: Jhon-Jhy Liaw, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 133 days.

This patent is subject to a terminal disclaimer.

(21) Appl. No.: 18/779,402

(22) Filed: Jul. 22, 2024

(65) Prior Publication Data

US 2024/0381606 A1 Nov. 14, 2024

Related U.S. Application Data

(63) Continuation of application No. 17/853,098, filed on Jun. 29, 2022, now Pat. No. 12,089,391.

(51) Int. Cl.

| | |
|---|---|
| ***H10B 10/00*** | (2023.01) |
| ***G11C 7/12*** | (2006.01) |
| ***G11C 11/408*** | (2006.01) |
| ***G11C 11/4096*** | (2006.01) |
| ***G11C 11/4097*** | (2006.01) |

(52) U.S. Cl.

CPC ............... *H10B 10/12* (2023.02); *G11C 7/12* (2013.01); *G11C 11/4085* (2013.01); *G11C 11/4096* (2013.01); *G11C 11/4097* (2013.01); *H10B 10/18* (2023.02)

(58) Field of Classification Search

CPC .......... H10B 10/12; H10B 10/18; G11C 7/12; G11C 11/4096; G11C 11/4097

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |

(Continued)

*Primary Examiner* — Min Huang

(74) *Attorney, Agent, or Firm* — Cooper Legal Group, LLC

(57) ABSTRACT

Semiconductor devices are provided. A first memory cell includes a first pull-down transistor, a first pass-gate transistor, a first pull-up transistor, and a first isolation transistor. A second memory cell includes a second pull-down transistor, a second pass-gate transistor, a second pull-up transistor, and a second isolation transistor. The first and second isolation transistors share a common gate connected to a VDD line. The gates of the first and second pass-gate transistors are connected to a first WL landing pad and a second WL landing pad. The sources of the first and second pass-gate transistors are connected to the first and second bit lines. The VDD line, the first and second WL landing pads, and the first and second bit lines are formed in a first metal layer, and the VDD line, the first and second bit lines are longer than the first and second WL landing pads.

20 Claims, 28 Drawing Sheets

(56) References Cited

U.S. PATENT DOCUMENTS

| | | | |
|---|---|---|---|
| 9,536,738 B2 | 1/2017 | Huang et al. | |
| 9,576,814 B2 | 2/2017 | Wu et al. | |
| 9,608,116 B2 | 3/2017 | Ching et al. | |
| 12,089,391 B2 * | 9/2024 | Liaw | H10B 10/125 |
| 2013/0154027 A1 | 6/2013 | Liaw | |
| 2017/0140812 A1 | 5/2017 | Yamamoto | |
| 2018/0182766 A1 | 6/2018 | Huang et al. | |
| 2021/0057421 A1 | 2/2021 | Liaw | |
| 2021/0098466 A1 * | 4/2021 | Liaw | H10D 89/10 |
| 2023/0262951 A1 | 8/2023 | Liaw | |

* cited by examiner

SEMICONDUCTOR DEVICE

CROSS REFERENCE TO RELATED APPLICATIONS

This Application is a Continuation of U.S. application Ser. No. 17/853,098, filed on Jun. 29, 2022, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Static Random Access Memory (SRAM) is commonly used in integrated circuits. SRAM cells have the advantageous feature of being able to hold data without the need to refresh. With the increasingly demanding requirements on the speed of integrated circuits, the read speed and write speed of SRAM cells have also become more important. With increased down-scaling of the already very small SRAM cells, however, such requests are difficult to achieve.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1A:
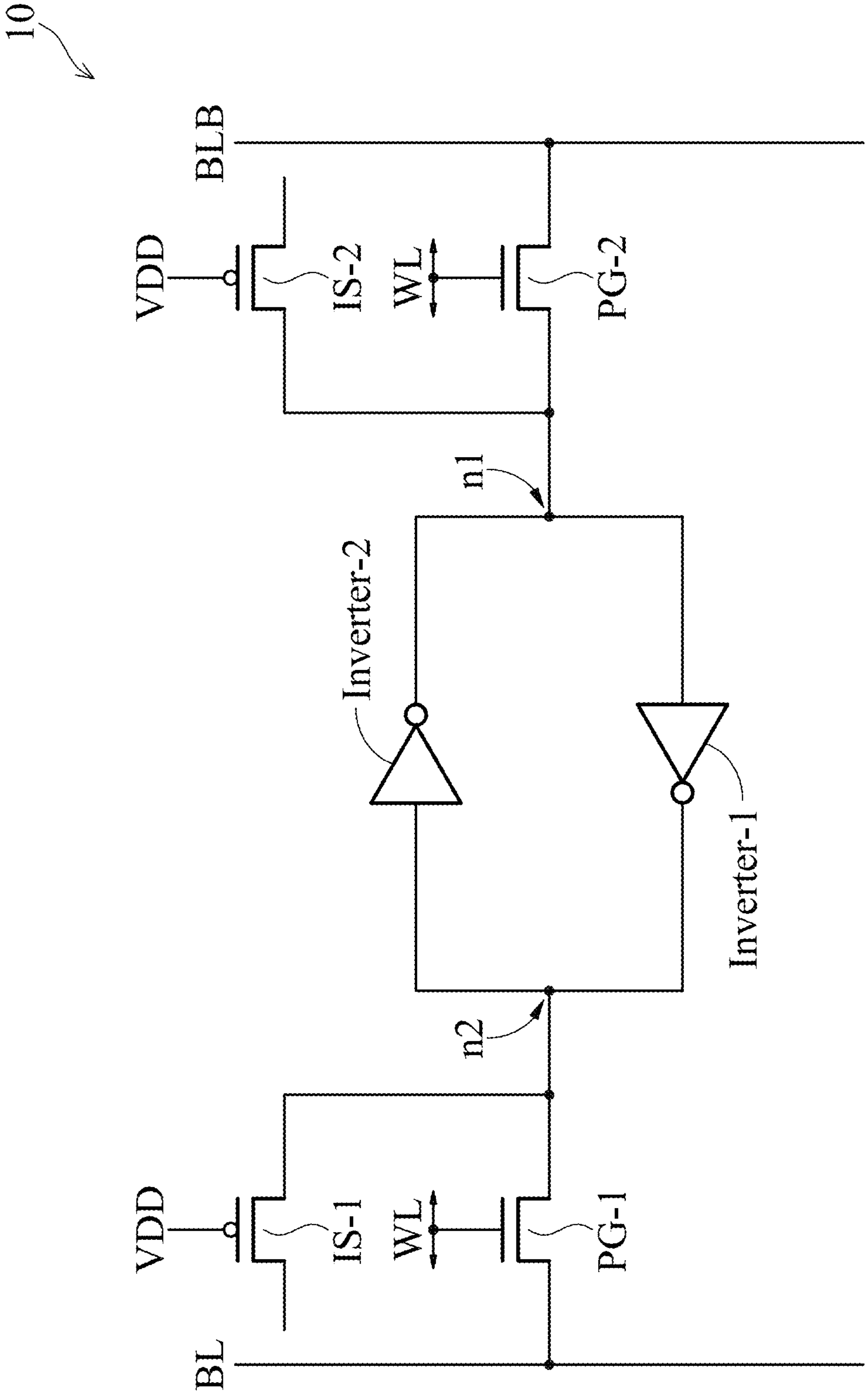
FIG. 1A shows a memory cell, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

In an IC, each memory includes multiple memory cells arranged in multiple rows and multiple columns of a cell array. In some embodiments, the memory cells have the same circuit configuration and the same semiconductor structure. In some embodiments, the memory cell may be a bit cell of SRAM.

FIG. 1A shows a memory cell 10, in accordance with some embodiments of the disclosure. In this embodiment, the memory cell 10 is a single-port SRAM bit cell. The memory cell 10 includes a pair of cross-coupled inverters Inverter-1 and Inverter-2, two pass-gate transistors PG-1 and PG-2, and two isolation transistors IS-1 and IS-2. The inverters Inverter-1 and Inverter-2 are cross-coupled between the data nodes n2 and n1, and form a latch circuit. In some embodiments, one of data nodes n2 and n1 is used as an output terminal of the latch circuit and the other data node is used as an input terminal of the latch circuit. The pass-gate transistor PG-1 is coupled between a bit line BL and the data node n2, and the pass-gate transistor PG-2 is coupled between a complementary bit line BLB and the data node n1, wherein the complementary bit line BLB is complementary to the bit line BL. The gates of the pass-gate transistors PG-1 and PG-2 are coupled to the same word-line WL. Furthermore, the pass-gate transistors PG-1 and PG-2 are NMOS transistors. The drain of the isolation transistor IS-1 is coupled to the data node n2, and the source of the isolation transistor IS-1 is floating. Moreover, the drain of the isolation transistor IS-2 are coupled to the data node n1, and the source of the isolation transistor IS-2 is floating. The gates of the isolation transistors IS-1 and IS-2 are coupled to the supply voltage VDD. In the memory cell 10, the isolation transistors IS-1 and IS-2 are PMOS transistors.

Figure 1B:
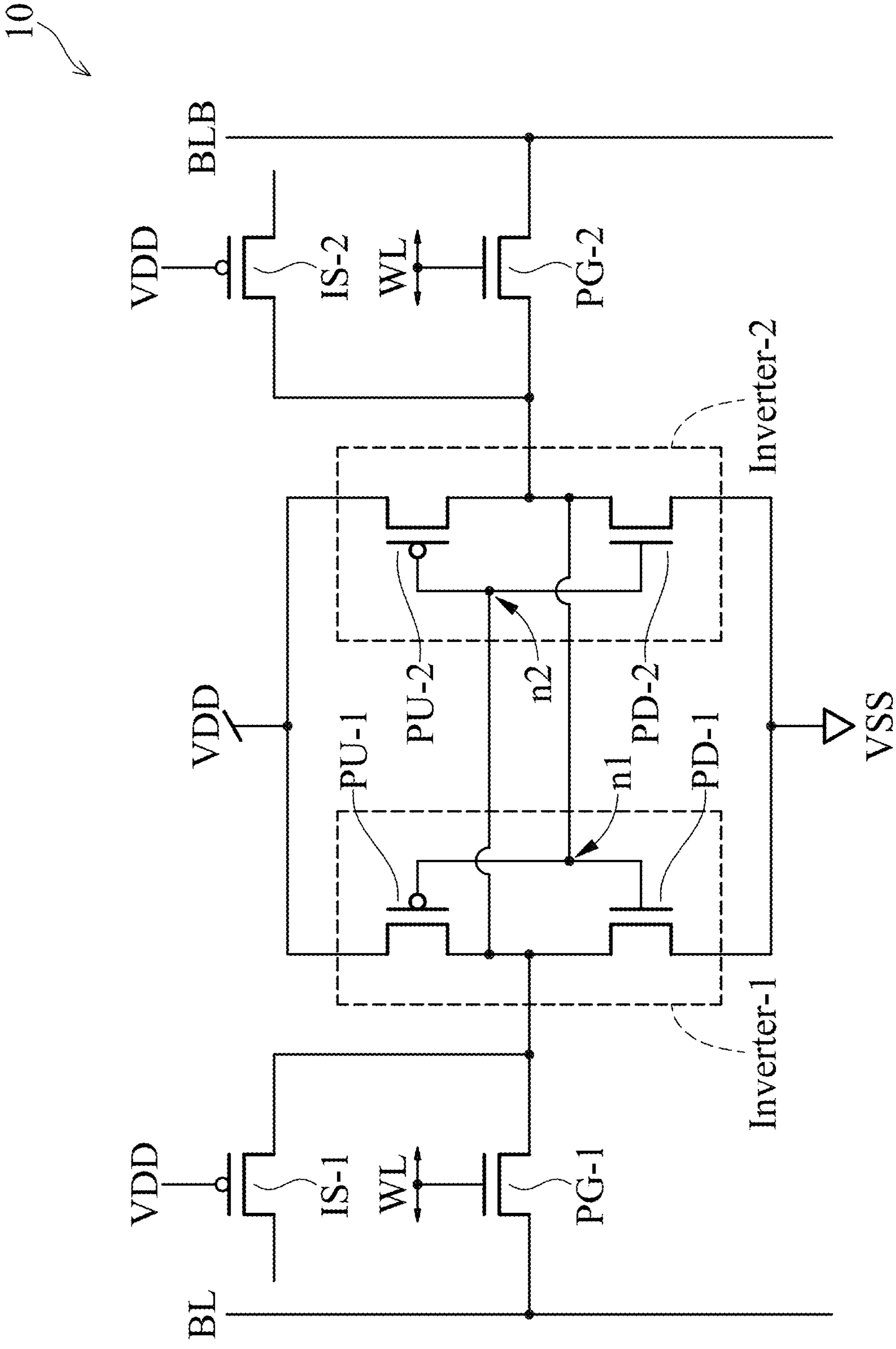
FIG. 1B shows a simplified diagram of the memory cell of FIG. 1A, in accordance with some embodiments of the disclosure.

FIG. 1B shows a simplified diagram of the memory cell 10 of FIG. 1A, in accordance with some embodiments of the disclosure. The inverter Inverter-1 includes a pull-up transistor PU-1 and a pull-down transistor PD-1. The pull-up transistor PU-1 is a PMOS transistor, and the pull-down transistor PD-1 is an NMOS transistor. The drain of the pull-up transistor PU-1 and the drain of the pull-down transistor PD-1 are coupled to the data node n2 connecting the pass-gate transistor PG-1. The gates of the pull-up transistor PU-1 and the pull-down transistor PD-1 are coupled to the data node n1 connecting the pass-gate transistor PG-2. Furthermore, the source of the pull-up transistor PU-1 is coupled to the power supply VDD, and the source of the pull-down transistor PD-1 is coupled to a ground VSS.

Similarly, the inverter Inverter-2 includes a pull-up transistor PU-2 and a pull-down transistor PD-2. The pull-up transistor PU-2 is a PMOS transistor, and the pull-down transistor PD-2 is an NMOS transistor. The drains of the pull-up transistor PU-2 and the pull-down transistor PD-2 are coupled to the data node n1 connecting the pass-gate transistor PG-2. The gates of the pull-up transistor PU-2 and the pull-down transistor PD-2 are coupled to the data node n2 connecting the pass-gate transistor PG-1. Furthermore, the source of the pull-up transistor PU-2 is coupled to the power supply VDD, and the source of the pull-down transistor PD-2 is coupled to the ground VSS.

The drain of the isolation transistor IS-1 is coupled to the data node n2, and the drain of the isolation transistor IS-2 is coupled to the data node n1. The sources of the isolation transistors IS-1 and IS-2 are depicted as floating. In some embodiments, the sources of the isolation transistors IS-1 and IS-2 may be coupled to respective isolation transistors IS-1/IS-2 in adjacent memory cells 10. The gates of the isolation transistors IS-1 and IS-2 are coupled to the power supply VDD, thus the isolation transistors IS-1 and IS-2 are turned off by the power supply VDD.

In some embodiments, the pass-gate transistors PG-1 and PG-2, the pull-up transistors PU-1 and PU-2, the pull-down transistors PD-1 and PD-2, and the isolation transistors IS-1 and IS-2 of the memory cell 10 are FinFETs. In some embodiments, the pass-gate transistors PG-1 and PG-2 and the pull-down transistors PD-1 and PD-2 are the single-fin FETs or the multiple-fin FETs, and the pull-up transistors PU-1 and PU-2 and the isolation transistors IS-1 and IS-2 are the single-fin FETs. In some embodiments, the pass-gate transistors PG-1 and PG-2, the pull-up transistors PU-1 and PU-2, the pull-down transistors PD-1 and PD-2, and the isolation transistors IS-1 and IS-2 of the memory cell 10 are gate-all-around (GAA) FETs.

Figure 2:
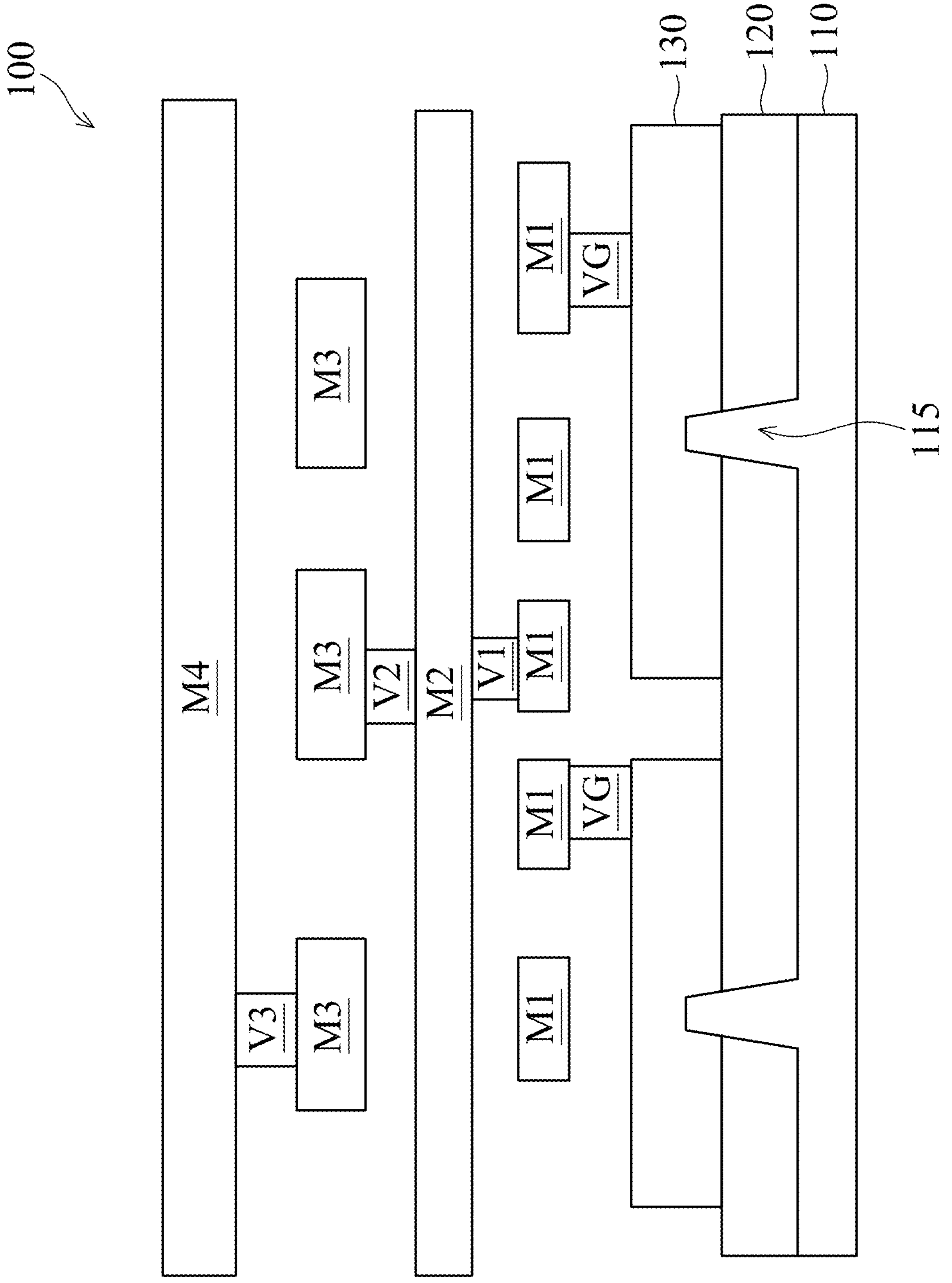
FIG. 2 shows a cross sectional view of a semiconductor device, in accordance with some embodiments of the disclosure.

FIG. 2 shows a cross sectional view of a semiconductor device 100, in accordance with some embodiments of the disclosure. In the semiconductor device 100, one or more memory cells 10 as illustrated in the disclosure are formed. Furthermore, Some components of the semiconductor device 100 are not depicted for clarity of FIG. 2.

The semiconductor device 100 includes a well region 110. In some embodiments, the well region 110 is a P-type well region, and the material of the P-type well region includes Si with Boron (B) doping. In some embodiments, the well region 110 is an N-type well region, and the material of the N-type well region includes Si with Phosphorus (P) doping.

The fins 115 form the active regions over the well region 110, and the gate structures 130 are formed over the fins 115.

The gate vias VG are formed over and connected to the gate structures 130 (e.g., the gate structures). Isolation feature 120 is over the well region 110 and under the gate structure 110. The isolation feature 120 is used for isolating the fin 115 of a transistor from other devices. In some embodiments, the isolation feature 120 may include different structures, such as shallow trench isolation (STI) structure, deep trench isolation (DTI) structure. Therefore, the isolation feature 120 is also referred as to as a STI feature or DTI feature.

The semiconductor device 100 further includes the vias V1, V2, and V3 and the metal lines M1, M2, M3 and M4 in an inter-metal dielectric (IMD). In some embodiments, the IMD may be multilayer structure, such as one or more dielectric layers. The metal lines M1, M2, M3 and M4 are formed in respective conductive layers, which are also referred to as metal layers. Moreover, the vias VG, V0 (not shown), V1, V2, and V3 are formed in respective via layers over the gate structures 130.

In FIG. 2, the conductive layers of the semiconductor device 100 include a first metal layer having first conductive features (e.g., the metal lines M1), a second metal layer having second conductive features (e.g., the metal lines M2), a third metal layer having third conductive features (e.g., the metal lines M3), and a fourth metal layer having fourth conductive features (e.g., the metal lines M4).

The via layers of semiconductor device 100 include a base via layer having the vias V0 (not shown) and the vias VG, a first via layer having the vias V1, a second via layer having the vias V2, and a third via layer having the vias V3. The vias V0 and the vias VG are arranged to connect at least some of the conductive structures (contacts) and the gate structures 130 with corresponding first metal lines M1. The vias V1 are arranged to connect at least some first metal lines M1 with the corresponding second metal lines M2. The vias V2 are arranged to connect at least some second metal lines M2 with the corresponding third metal lines M3. The vias V3 are arranged to connect at least some third metal lines M3 with the corresponding fourth metal lines M4.

FIG. 2 is used as to demonstrate the spatial relationship among various metal layers and via layers. In some embodiments, the numbers of conductive features at various layers are not limited to the example depicted in FIG. 2. In some embodiments, there are one or more metal layers and one or more via layers over the fourth metal lines M4.

Figure 3A:
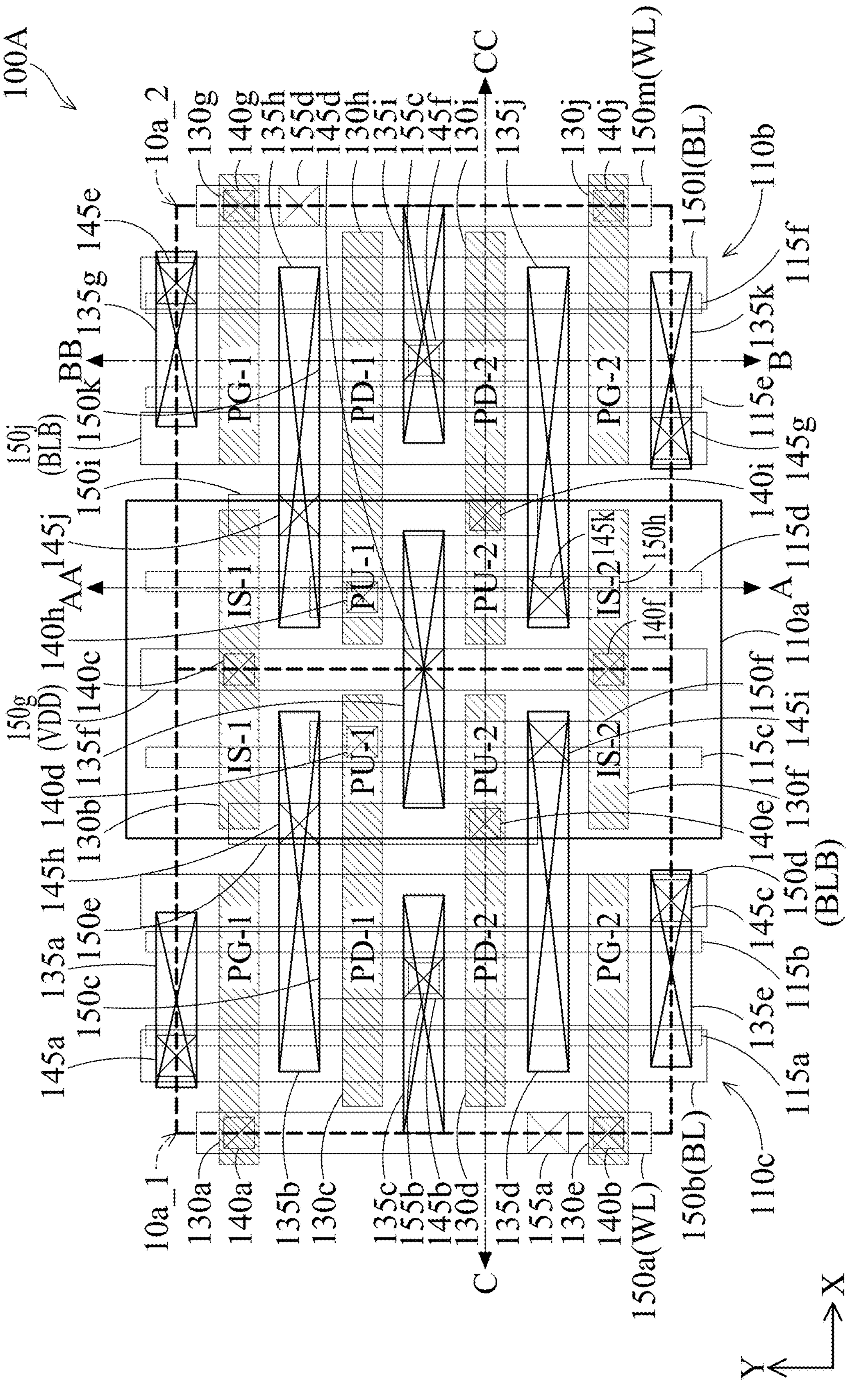
FIG. 3A shows a top view of two adjacent memory cells in a semiconductor device, with all the depictions regarding components in and under the first metal layer of FIG. 2, in accordance with some embodiments of the disclosure.
Figure 3B:
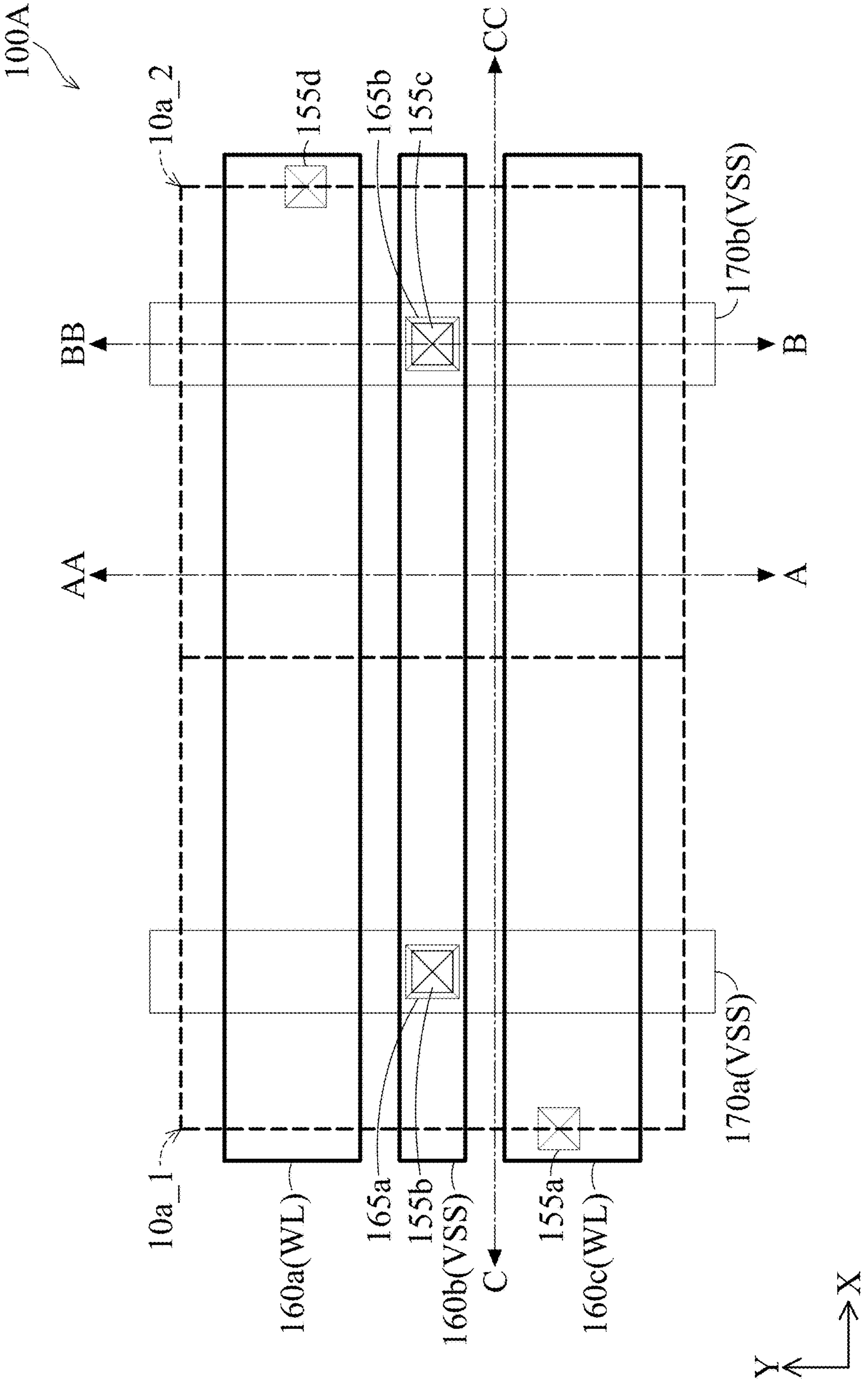
FIG. 3B shows a top view of the memory cells of FIG. 3A, with all the depictions regarding components over the first metal layer.
Figure 3C:
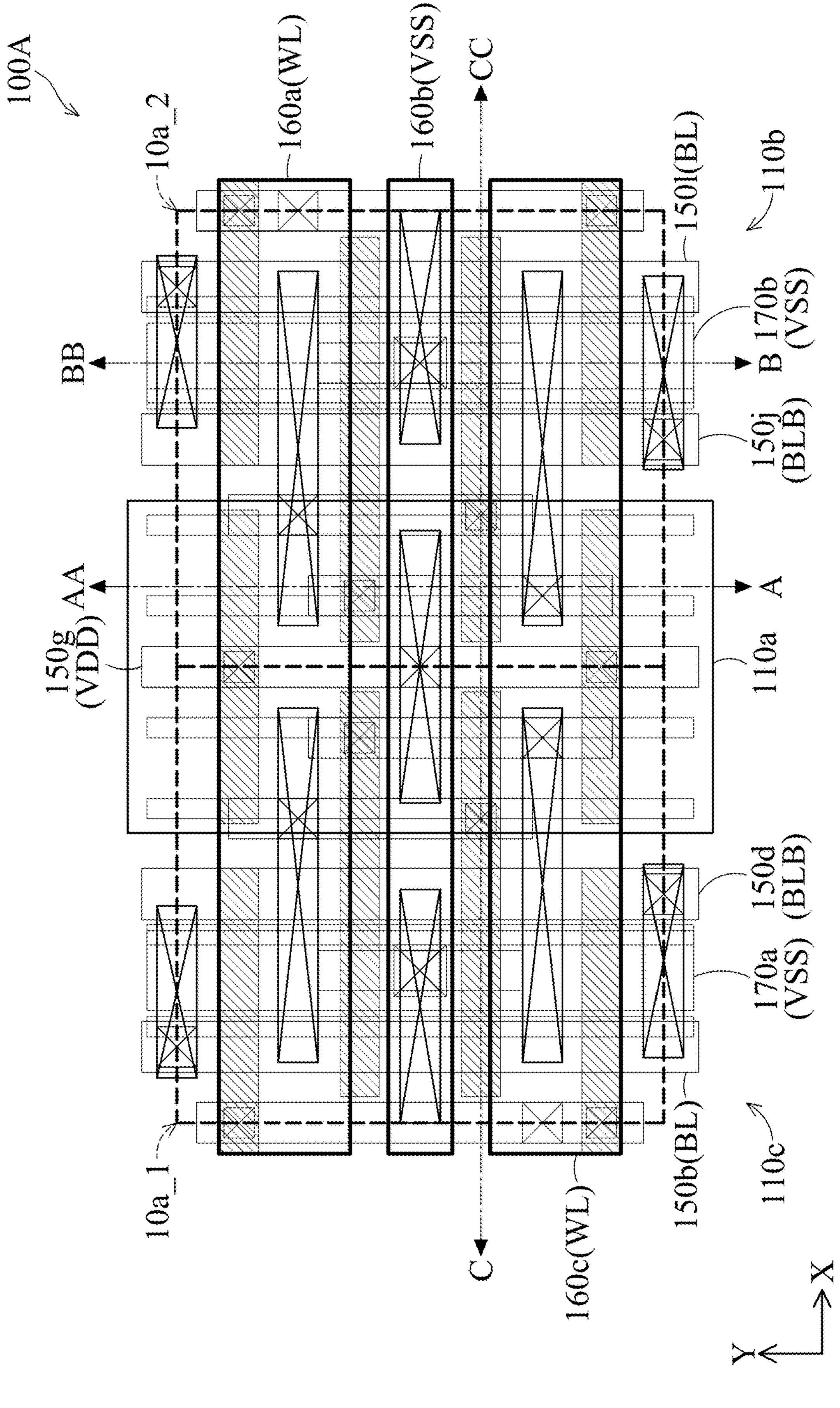
FIG. 3C shows a top view of the memory cells of FIG. 3A, with all the depictions regarding components under the third metal layer.

FIG. 3A shows a top view of the memory cells 10*a*_1 and 10*a*_2 in a semiconductor device 100A, with all the depictions regarding components in and under the first metal layer of FIG. 2, in accordance with some embodiments of the disclosure. FIG. 3B shows a top view of the memory cells 10*a*_1 and 10*a*_2 of FIG. 3A, with all the depictions regarding components over the first metal layer. FIG. 3C shows a top view of the memory cells 10*a*_1 and 10*a*_2 of FIG. 3A, with all the depictions regarding components under the third metal layer.

In FIGS. 3A through 3C, the same components in the memory cells 10*a*_1 and 10*a*_2 are given the same reference numbers, and detailed description thereof is thus omitted. Furthermore, the memory cell 10*a*_1 is in contact with the adjacent memory cell 10*a*_2.

The memory cells 10*a*_1 and 10*a*_2 are an implementation of the single-port memory cell 10 depicted in FIG. 1. That is, each of the memory cells 10*a*_1 and 10*a*_2 is an 8T SRAM cell with eight (8) transistors, including two pass-gate transistors PG-1 and PG-2, two pull-up transistors PU-1 and PU-2, two pull-down transistors PD-1 and PD-2, and two isolation transistors IS-1 and IS-2. In this embodiment, the transistors in the memory cells 10*a*_1 and 10*a*_2 are fin-like field effect transistors (FinFETs). The boundaries of the memory cells 10*a*_1 and 10*a*_2 are indicated by dashed lines.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The memory cells 10*a*_1 and 10*a*_2 are joined along a center line extending along the Y direction. In other words, the memory cells 10*a*_1 and 10*a*_2 are arranged in mirror symmetry along the Y direction. It is noted that the illustration of the cells 10*a*_1 and 10*a*_2 is for the purposes of demonstrating the highly symmetric nature of the SRAM cells of the present disclosure and how two adjacent SRAM cells share the same N-type well region 110*a*. Thus, device stability and cell matching are improved, so as to increase the chip speed and achieve lower power supply for the memory device.

Each of the SRAM cells 10*a*_1 and 10*a*_2 includes a cell height H1 along the Y direction and a cell width W1 along the X direction. In this embodiment, the cell height H1 spans over a total of 4 gate structures and is measured at about 4 gate pitches. Each gate pitch includes a gate length along the Y direction and a gate spacing between two adjacent gate structures along the Y direction.

The memory cell 10*a*_1 includes a substrate (not labeled) having a P-type well region 110*c* and an N-type well region 110*a*. The memory cell 10*a*_1 includes the active regions formed by the fins 115*a*, 115*b* and 115*c* extending along the Y direction. The fins 115*a* and 115*b* are formed in the P-type well region 110*c*, and the fin 115*c* is formed in the N-type well region 110*a*. The number of fins for each transistor is provided as an example. In some embodiments, any number of fins are within the scope of various embodiments.

In the memory cell 10*a*_1, a gate structure 130*a* forms the pass-gate transistor PG-1 with the underlying fins 115*a* and 115*b* in the P-type well region 110*c*. A gate structure 130*e* forms the pass-gate transistor PG-2 with the underlying fins 115*a* and 115*b* in the P-type well region 110*c*. The gate structures 130*a* and 130*e* are electrically connected to the metal line 150*a* through the gate vias 140*a* and 140*b*, respectively. In some embodiments, the gate structures 130*a* and 130*e* are shared with the adjacent memory cell.

In the memory cell 10*a*_1, a gate structure 130*c* forms the pull-down transistor PD-1 with the underlying fins 115*a* and 115*b* in the P-type well region 110*c*. Furthermore, the gate structure 130*c* further forms the pull-up transistor PU-1 with the underlying fin 115*c* in the N-type well region 110*a*. In other words, the gate structure 130*c* is shared by the pull-up transistor PU-1 and the pull-down transistor PD-1, and the gate structure 130*c* corresponds to the data node n1. Furthermore, the gate structure 130*c* is not shared with the adjacent memory cell.

In the memory cell 10*a*_1, a gate structure 130*d* forms the pull-down transistor PD-2 with the underlying fins 115*a* and 115*b* in the P-type well region 110*c*. Furthermore, the gate structure 130*d* further forms the pull-up transistor PU-2 with the underlying fin 115*c* in the N-type well region 110*a*. In other words, the gate structure 130*d* is shared by the pull-up transistor PU-2 and the pull-down transistor PD-2, and the gate structure 130*d* corresponds to the data node n2. Furthermore, the gate structure 130*d* is not shared with the adjacent memory cell.

The pull-up transistors PU-1 and PU-2 are formed in the continuous active region corresponding to the fin 115*c*, so as to improve device mismatch and Ion (turned-on current) boost and avoid length of diffusion (LOD) effect for the pull-up transistors PU-1 and PU-2.

In the memory cell 10*a*_1, a gate structure 130*b* forms the isolation transistor IS-1 with the underlying fin 115*c* in the N-type well region 110*a*. A gate structure 130*f* forms the isolation transistor IS-2 with the underlying fin 115*c* in the N-type well region 110*a*. The gate structures 130*b* and 130*f* are electrically connected to the metal line 150*g* through the gate vias 140*c* and 140*f*, respectively. In the semiconductor device 100A, the isolation transistors IS-2 of the memory cells 10*a*_1 and 10*a*_2 share the same gate structure 130*f*, and the isolation transistors IS-1 of the memory cells 10*a*_1 and 10*a*_2 share the same gate structure 130*b*. In this embodiment, the isolation transistors IS-1 and IS-2 of the memory cells 10*a*_1 and 10*a*_2 are formed without extra process cost and area.

In the memory cell 10*a*_1, the pass-gate transistors PG-1 and PG-2 and the pull-down transistors PD-1 and PD-2 share the same active regions corresponding to the fins 115*a* and 115*b*. Furthermore, the isolation transistors IS-1 and IS-2 and the pull-up transistors PU-1 and PU-2 share the same active region corresponding to the fin 115*c*.

The memory cell 10*a*_2 includes a P-type well region 110*a*_2 and the N-type well region 110*a*. In some embodiments, the P-type well regions 110*a*_2 and 110*c* are separated by the N-type well region 110*a*. In some embodiments, the P-type well regions 110*a*_2 and 110*c* are the same P-type well region. The memory cell 10*a*_2 includes the active regions formed by the fins 115*d*, 115*e* and 115*f* extending along the Y direction. The fins 115*e* and 115*f* are formed in the P-type well region 110*b*, and the fin 115*d* is formed in the N-type well region 110*a*. The number of fins for each transistor is provided as an example. In some embodiments, any number of fins are within the scope of various embodiments.

In the memory cell 10*a*_2, a gate structure 130*g* forms the pass-gate transistor PG-1 with the underlying fins 115*e* and 115*f* in the P-type well region 110*b*. A gate structure 130*j* forms the pass-gate transistor PG-2 with the underlying fins 115*e* and 115*f* in the P-type well region 110*b*. The gate structures 130*g* and 130*j* are electrically connected to the metal line 150*m* through the gate vias 140*g* and 140*j*, respectively. In some embodiments, the gate structure 130*g* and 130*j* are shared with the adjacent memory cell.

In the memory cell 10*a*_2, a gate structure 130*h* forms the pull-down transistor PD-1 with the underlying fins 115*e* and 115*f* in the P-type well region 110*b*. Furthermore, the gate structure 130*h* further forms the pull-up transistor PU-1 with the underlying fin 115*d* in the N-type well region 110*a*. In other words, the gate structure 130*h* is shared by the pull-up transistor PU-1 and the pull-down transistor PD-1, and the gate structure 130*h* corresponds to the data node n1. Furthermore, the gate structure 130*h* is not shared with the adjacent memory cell.

In the memory cell 10*a*_2, a gate structure 130*i* forms the pull-down transistor PD-2 with the underlying fins 115*e* and 115*f* in the P-type well region 110*b*. Furthermore, the gate structure 130*i* further forms the pull-up transistor PU-2 with the underlying fin 115*d* in the N-type well region 110*a*. In other words, the gate structure 130*i* is shared by the pull-up transistor PU-2 and the pull-down transistor PD-2, and the gate structure 130*i* corresponds to the data node n2. Furthermore, the gate structure 130*i* is not shared with the adjacent memory cell.

In the memory cell 10*a*_2, the pass-gate transistors PG-1 and PG-2 and the pull-down transistors PD-1 and PD-2 share the same active regions corresponding to the fins 115*e* and 115*f*. Furthermore, the isolation transistors IS-1 and IS-2 and the pull-up transistors PU-1 and PU-2 share the same active region corresponding to the fin 115*d*.

In the memory cells 10*a*_1 and 10*a*_2, the pull-down transistors PD-1 and PD-2 are disposed between the pass-gate transistors PG-1 and PG-2 on the P-type well region 110*c*. Furthermore, the pull-up transistors PU-1 and PU-2 are disposed between the isolation transistors IS-1 and IS-2 on the N-type well region 110*a*.

In the semiconductor device 100A, the source/drain contacts 135*a* through 135*j* and the gate structures 130*a* through 130*j* extend in the X direction. The metal lines 150*a* through 150*m* are formed in the first metal layer and extend in the Y direction. The source/drain contacts 135*a* through 135*j* are configured to connect the source/drain regions of the transistors. Source/drain region(s) may refer to a source or a drain, individually or collectively dependent upon the context.

In the memory cell 10*a*_1, the source/drain contacts 135*a* and 135*b* overlap the fins 115*a* and 115*b* and correspond to source and drain of the pass-gate transistor PG-1. The source/drain contact 135*a* is electrically connected to the metal line 150*b* through the via 145*a*. Furthermore, the source/drain contacts 135*b* and 135*c* overlap the fins 115*a* and 115*b* and correspond to the drain and source of the pull-down transistor PD-1. The source/drain contact 135*b* is electrically connected to the gate structure 130*d* through the via 145*h*, the metal line 150*e*, and the gate via 140*e* in sequence. The metal line 150*e* is a local connection line configured to form an electrical connection between the source/drain contact 135*b* and the gate structure 130*d*. The source/drain contact 135*c* is electrically connected to the metal line 150*c* through the via 145*b*.

In the memory cell 10*a*_1, the source/drain contacts 135*e* and 135*d* overlap the fins 115*a* and 115*b* and correspond to source and drain of the pass-gate transistor PG-2. The source/drain contact 135*e* is electrically connected to the metal line 150*d* through the via 145*c*. Furthermore, the source/drain contacts 135*d* and 135*c* overlap the fins 115*a* and 115*b* and correspond to the drain and source of the pull-down transistor PD-2. The source/drain contact 135*d* is electrically connected to the gate structure 130*c* through the via 145*i*, the metal line 150*f*, and the gate via 140*d* in sequence. The metal line 150*f* is a local connection line configured to form an electrical connection between the source/drain contact 135*d* and the gate structure 130*c*.

In the memory cell 10*a*_1, the source/drain contact 135*b* overlaps the fin 115*c* and corresponds to drain of the isolation transistor IS-1. The source/drain contacts 135*f* and 135*b* overlap the fin 115*c* and correspond to source and drain of the pull-up transistor PU-1. The source/drain contacts 135*f* is electrically connected to the metal line 150*g* through the via 145*d*. Furthermore, the source/drain contacts 135*f* is shared by the memory cells 10*a*_1 and 10*b*. The source/drain contact 135*b* is shared by the pull-up transistor PU-1 and the pull-down transistor PD-1. The source/drain contact 135*d* overlaps the fin 115*c* and corresponds to drain of the isolation transistor IS-2. The source/drain contacts 135*f* and 135*d* overlap the fin 115*c* and correspond to source and drain of the pull-up transistor PU-2. The source/drain contact 135*d* is shared by the pull-up transistor PU-2 and the pull-down transistor PD-2.

As described above, the memory cell 10*a*_2 has a configuration mirrored-identical to the memory cell 10*a*. Thus, the configuration of the metal lines and the source/drain contacts of the eight transistors in the memory cell 10*a*_2 is similar to that of the eight transistors in the memory cell 10*a*.

The metal lines 150*a* through 150*m* are formed in the first metal layer, which is the lowest level metal layer. The metal line 150*b* functions as the bit line BL and the metal line 150*d* functions as a complementary bit line BLB for the memory cell 10*a*_1. The memory cells arranged in the same column as the memory cell 10*a*_1 share the same bit line BL through the metal line 150*b* and the same complementary bit line BLB through the metal line 150*d*. Similarly, the metal line 150*l* functions as the bit line BL and the metal line 150*j* functions as a complementary bit line BLB for the memory cell 10*a*_2. The memory cells arranged in the same column as the memory cell 10*a*_2 share the same bit line BL through the metal line 150*l* and the same complementary bit line BLB through the metal line 150*j*.

The metal line 150*g* functions as the VDD line (or VDD conductor) for the memory cells 10*a*_1 and 10*a*_2. In this embodiment, the VDD line is shared by the memory cells 10*a*_1 and 10*a*_2. For example, the metal line 150*g* is disposed at the right boundary of the memory cell 10*a*_1 and the left boundary of the memory cell 10*a*_2. Moreover, the memory cells arranged in the same columns as memory cells 10*a*_1 and 10*a*_2 share the same VDD line through the metal line 150*g*.

The metal line 150*a* functions as a landing pad (or a landing line) of the word line WL for the memory cell 10*a*_1, and the landing pad of the word line WL is shared by the memory cell adjacent to the memory cell 10*a*_1. For example, the metal line 150*a* is disposed at the left boundary of the memory cell 10*a*_1. The metal line 150*m* functions as a landing pad of the word line WL for the memory cell 10*a*_2, and the landing pad of the word line WL is shared by the memory cell adjacent to the memory cell 10*a*_2. For example, the metal line 150*m* is disposed at the right boundary of the memory cell 10*a*_2. The metal line 150*c* functions as a landing pad of the VSS line for the memory cell 10*a*_1, and the metal line 150*k* functions as a landing pad of the VSS line for the memory cell 10*a*_2.

In this embodiment, the metal lines 150*b* (i.e., the bit line BL), the metal line 150*d* (i.e., the complementary bit line BLB) and the metal line 150*g* (i.e., the VDD line) are longer than the metal line 150*a* (i.e., the word line landing pad) in the Y direction. In some embodiments, the metal lines 150*b*, 150*d*, 150*j* and 150*l* are wider than the other metal lines of the memory cells 10*a*_1 and 10*a*_2 in the first metal layer.

The memory cells 10*a*_1 and 10*a*_2 have a rectangular shape with a cell width W1 measurable along the X direction and a cell height H1 measurable along the Y direction. In some embodiments, the ration of the cell width W1 to the cell height H1 is within a range of about 0.75 to about 1.5. In some embodiments, a memory macro is formed but repeating and abutting memory cells having a configuration identical or mirrored-identical to the memory cells 10*a*_1 and 10*a*_2. Moreover, the cell width W1 is also referred to as a cell pitch along the X direction, and the cell height H1 is also referred to as a cell pitch along the Y direction.

In FIG. 3B, the metal lines 160*a* through 160*c* are formed in the second metal layer and extend in the X direction. The metal lines 160*a* and 160*c* are wider than the metal line 160*b*. The vias 155*a* through 155*d* are formed in the first via layer between the first and second metal layers. The metal lines 170*a* and 170*b* are formed in the third metal layer and extend in the Y direction. The vias 165*a* and 165*b* are formed in the second via layer between the second and third metal layers.

The metal line 160*a* is electrically connected to the metal line 150*m* through the via 155*d*, and the metal line 160*a* functions as the word line WL (e.g., a second word line WL) for the memory cell 10*a*_2. The metal line 160*c* is electrically connected to the metal line 150*a* through the via 155*a*, and the metal line 160*c* functions as the word line WL (e.g., a first word line WL) for the memory cell 10*a*_1. In other words, the adjacent memory cells 10*a*_1 and 10*a*_2 arranged in the same row are controlled by the different word lines WL. The metal line 160*b* is electrically connected to the metal lines 150*c* and 150*k* through the vias 155*b* and 155*c*, respectively. The metal line 160*b* functions as the VSS line (or VSS conductor) for the memory cells 10*a*_1 and 10*a*_2. The metal lines 160*a* and 160*c* are separated by the metal line 160*b*. In other words, the word lines WL of the memory cells 10*a*_1 and 10*a*_2 are separated by the VSS line.

The metal lines 160*a* and 160*c* are parallel to each other. Furthermore, the metal line 160*a* overlaps the gate structure 130*c* of the memory cell 10*a*_1 and the gate structure 130*h* of the memory cell 10*a*_2. Similarly, the metal line 160*c* overlaps the gate structure 130*d* of the memory cell 10*a*_1 and the gate structure 130*i* of the memory cell 10*a*_2.

The metal line 160*b* is electrically connected to the metal lines 170*a* and 170*b* through the vias 165*a* and 165*b*, respectively. In other words, the metal lines 170*a* and 170*b* and the metal line 160*b* form a power mesh for the VSS line. In FIG. 3B, only the metal lines 170*a* and 170*b* are arranged in the third metal layers. Therefore, a large amount of routing area is reserved for signal routing.

Figure 4A:
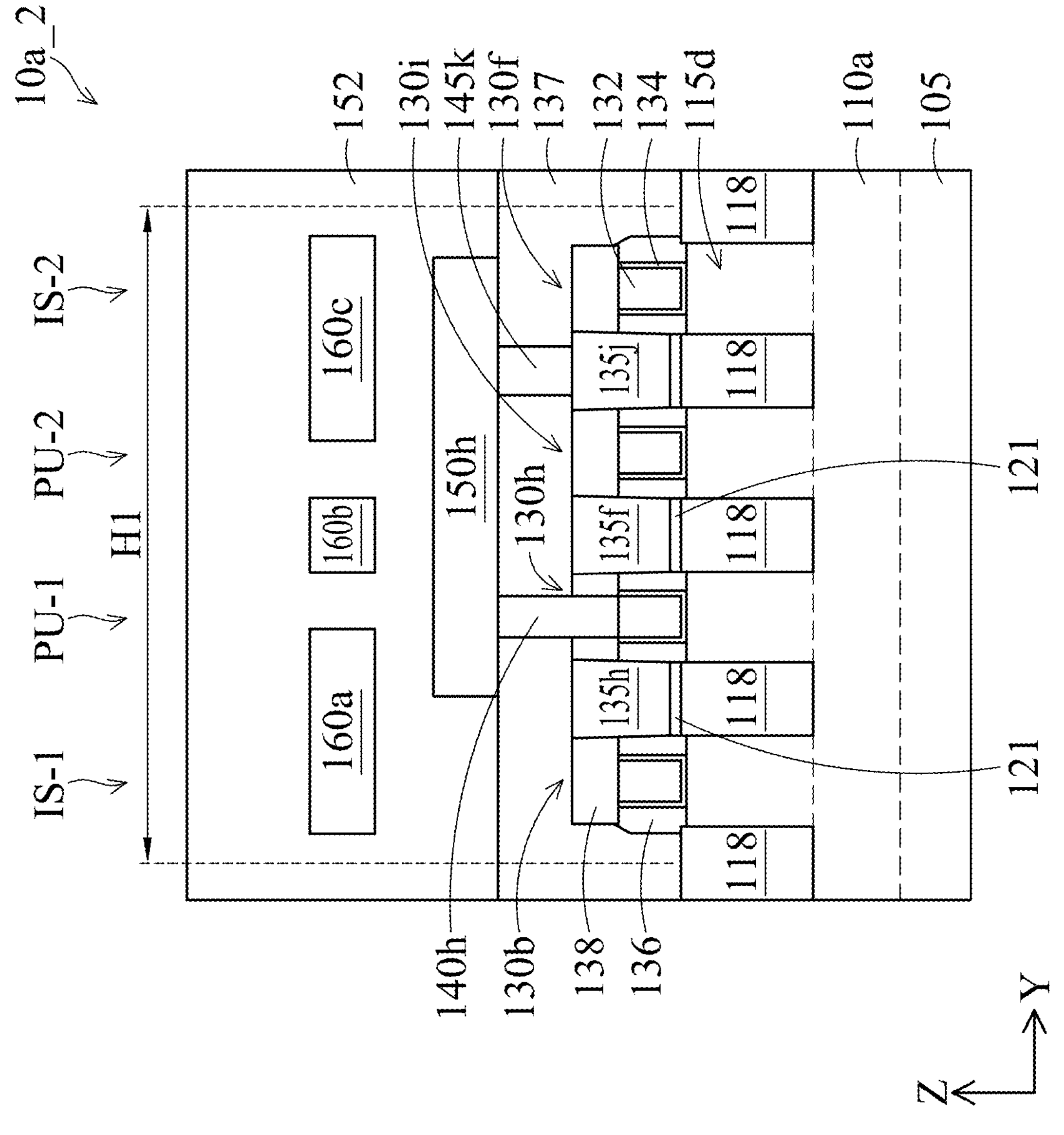
FIG. 4A shows a cross sectional view of the semiconductor device along a line A-AA in FIGS. 3A through 3C, in accordance with some embodiments of the disclosure.

FIG. 4A shows a cross sectional view of the semiconductor device 100A along a line A-AA in FIGS. 3A through 3C, in accordance with some embodiments of the disclosure. As described above, the memory cells 10*a*_1 and 10*a*_2 have a cell height (or cell pitch) H1 measurable along the Y direction. In FIG. 4A, the cross sectional view of the pull-up transistors PU-1 and PU-2 and the isolation transistors IS-1 and IS-2 of the memory cell 10*a*_2 are illustrated, and the pull-up transistors PU-1 and PU-2 and the isolation transistors IS-1 and IS-2 are P-type Fin FETs. In this embodiment, the cell height H1 is the same as 4 times the contacted poly pitch (CPP), i.e., 4 times the gate pitch for the gate structures 130*a* through 130*j*.

The N-type well region 110*a*_1 is formed over the substrate 105. The substrate 105 may contains a semiconductor material, such as bulk silicon (Si). In some other embodiments, the substrate 105 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 105 may also include an insulating layer, such as a silicon oxide layer, to have a silicon-on-insulator (SOI) structure or a germanium-on-insulator (GOI) structure.

The fin 115*d* is formed in the N-type well region 110*a*. In some embodiments, the source/drain features 118 are formed by the epitaxially-grown material. In some embodiments, for an N-type transistor, the epitaxially-grown materials may include SiP, SiC, SiPC, SiAs, Si, or a combination thereof. In some embodiments, for a P-type transistor, the epitaxially-grown materials may include SiGe, SiGeC, Ge, Si, a boron-doped SiGe, boron and carbon doped SiGe, or a combination thereof.

The silicide features 121 are formed between the source/drain contacts 135*a* through 135*k* and the source/drain features 118. The silicide features 121 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

In the memory cells 10*a*_1 and 10*a*_2, each of the gate structures 130*a* through 130*j* includes the gate feature (e.g., the gate electrode) 132, the gate dielectric layer 134, the gate spacer 136 and the gate top dielectric layer 138. In some embodiments, the gate feature 132 may include polysilicon or work function metal. The work function metal includes TIN, TaN, TiAl, TiAlN, TaAl, TaAlN, TaAlC, TaCN, WNC, Co, Ni, Pt, W, combinations thereof, or other suitable material.

In some embodiments, the gate feature 132 may include a capping layer, a barrier layer, an n-type work function metal layer, a p-type work function metal layer, and a fill material (not shown). In some embodiments, the P-type transistors and the N-type transistors are formed by the same work function material. In some embodiments, the P-type transistors and the N-type transistors are made of different work function materials.

The gate dielectric layer 134 may include dielectric materials, such as silicon oxide, silicon nitride, silicon oxynitride, dielectric material(s) with high dielectric constant (high-k), or a combination thereof. Examples of high-k dielectric materials include $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, (Ba, Sr) $TiO_3$ (BST), $Al_2O_3$, $Si_3N_4$, oxynitrides (SiON), combinations thereof, or other suitable material.

The gate spacers 136 are on sidewalls of the gate dielectric layer 134. The gate spacers 136 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 136 may include a single layer or a multi-layer structure.

The gate top dielectric layer 138 is over the gate dielectric layer 134 and the gate feature 132. The gate top dielectric layer 138 is used for contact etch protection layer. The material of the gate top dielectric layer 138 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), combinations thereof, or other suitable material.

The via 145*k* is formed in the inter-layer dielectric (ILD) 137, and the metal line 150*h* is electrically connected to the source/drain contact 135*j* of the pull-up transistor PU-2 and the isolation transistor IS-2 through the via 145*k*. The gate via 140*h* is formed over the gate feature 132 of the gate structure 130*h* and extends through the top dielectric layer 138 and the ILD 137. The gate feature 132 of the gate structure 130*h* is electrically connected to the metal line 150*h* through the gate via 140*h*. The metal lines formed in the first through third metal layers and the vias formed in the first through second via layers are formed in an inter-metal dielectric (IMD) 152. In such embodiments, the metal line 150*h* extends in the Y direction and overlap the pull-up transistors PU-1 and PU-2 and the isolation transistor IS-2. It should be noted that no source/drain contact 135 is formed over the source/drain feature 118 corresponding to the sources of the isolation transistors IS-1 and IS-2.

Figure 4B:
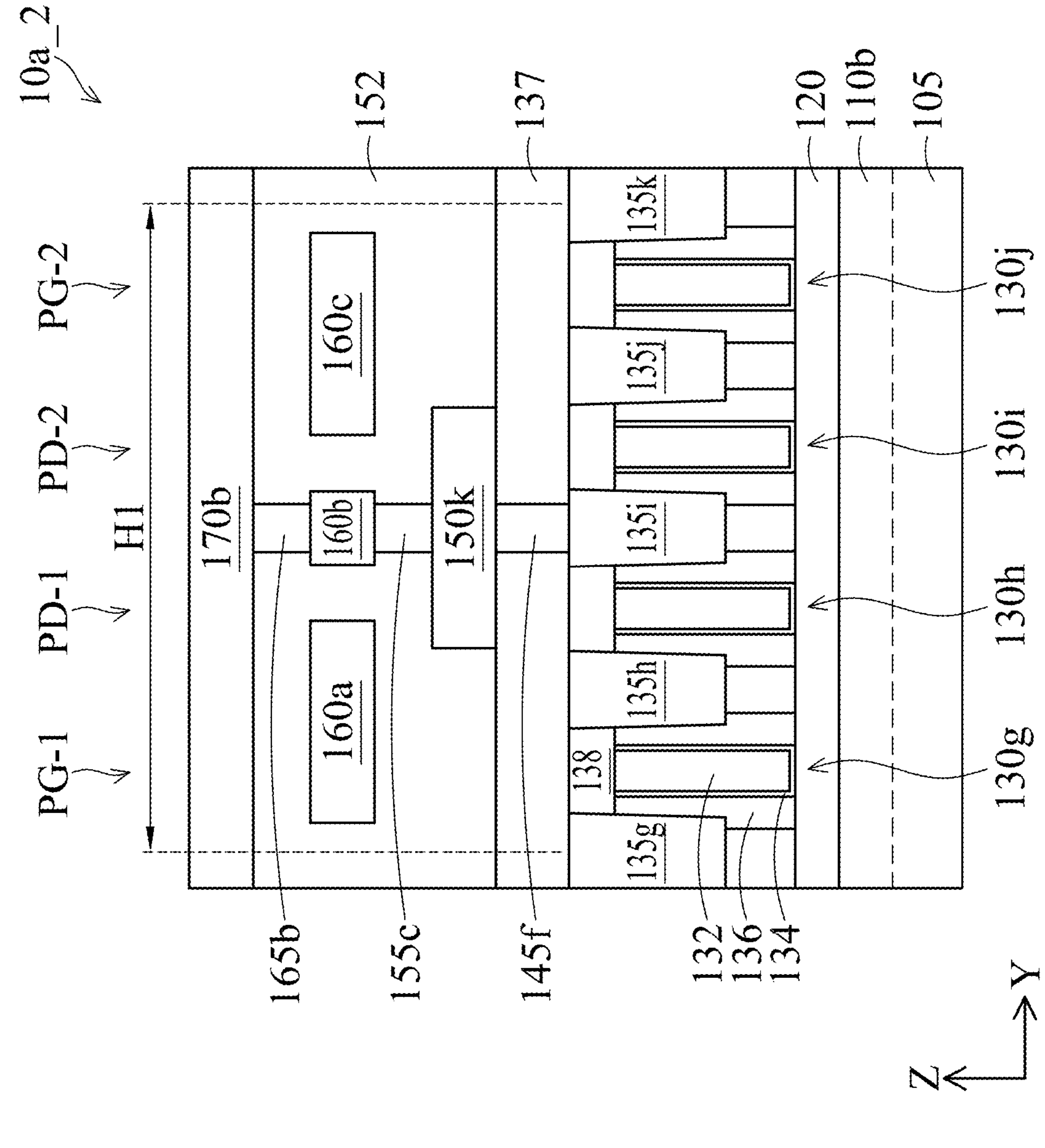
FIG. 4B shows a cross sectional view of the semiconductor device along a line B-BB in FIGS. 3A through 3C, in accordance with some embodiments of the disclosure.

FIG. 4B shows a cross sectional view of the semiconductor device 100A along a line B-BB in FIGS. 3A through 3C, in accordance with some embodiments of the disclosure. In FIG. 4B, the cross sectional view of the pull-down transistors PD-1 and PD-2 and the pass-gate transistors PG-1 and PG-2 of the memory cell 10*a*_2 are illustrated, and the pull-down transistors PD-1 and PD-2 and the pass-gate transistors PG-1 and PG-2 are N-type transistors.

The P-type well region 110*a*_2 is formed over the substrate 105. The isolation feature 120 is formed over the P-type well region 110*b*. The gate structures 130*g* through 130*j* are formed over the isolation feature 120.

The metal line 150*k* extends in the Y direction and overlap the pull-down transistors PD-1 and PD-2. The metal line 170 is electrically connected to the source/drain contact 135*i* through the via 145*f*. The metal line 170 is further electrically connected to the metal line 170*b* through the via 155*c*, the metal line 160*b* and the via 165*b* in sequence.

Figure 4C:
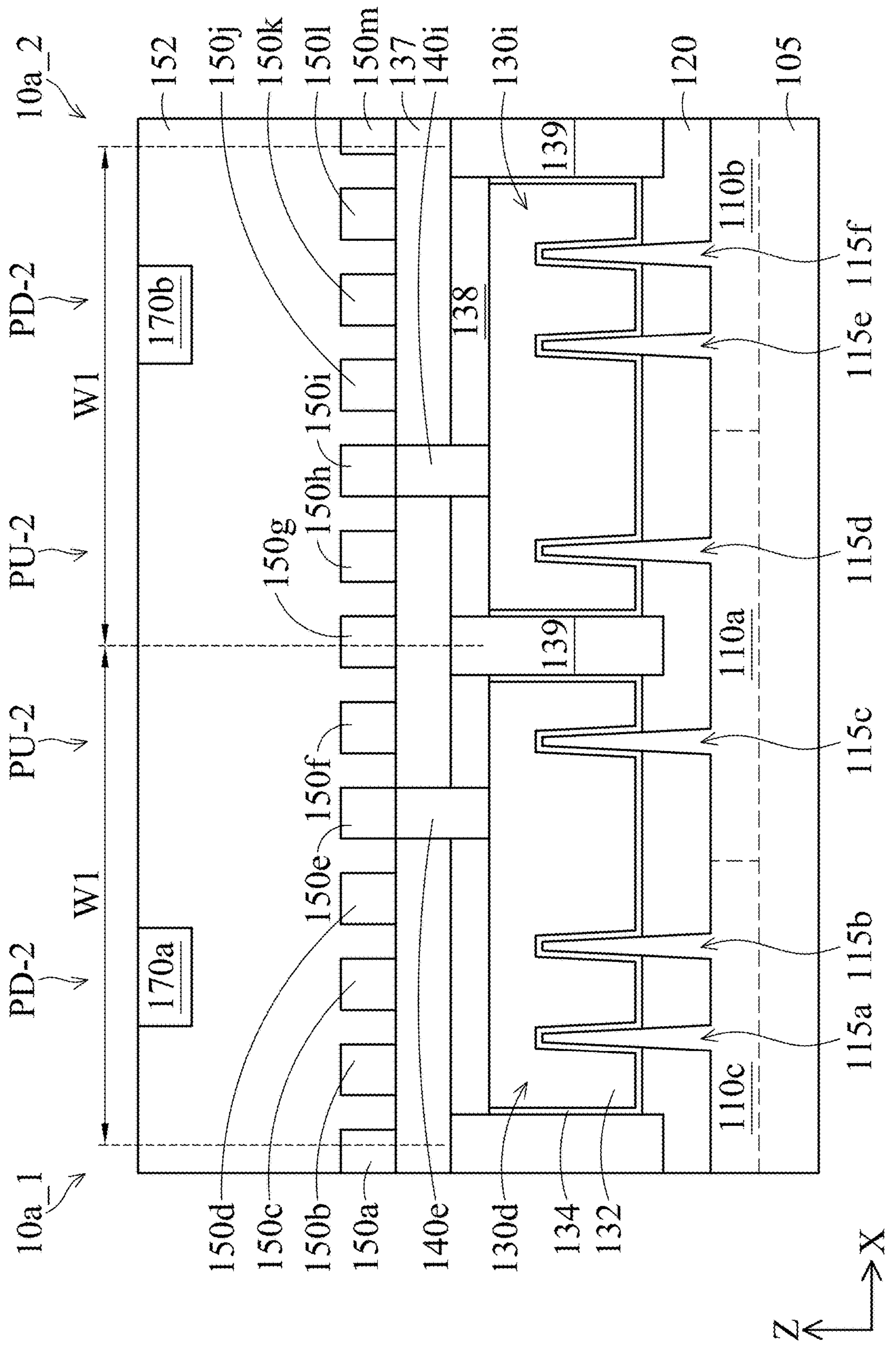
FIG. 4C shows a cross sectional view of the semiconductor device along a line C-CC in FIGS. 3A through 3C, in accordance with some embodiments of the disclosure.

FIG. 4C shows a cross sectional view of the semiconductor device 100A along a line C-CC in FIGS. 3A through 3C, in accordance with some embodiments of the disclosure. As described above, the memory cells 10*a*_1 and 10*a*_2 have a cell width (or cell pitch) W1 measurable along the X direction. In FIG. 4C, the cross sectional view of the pull-up transistors PU-2 and the pull-down transistors PD-2 of the memory cells 10*a*_1 and 10*a*_2 are illustrated, and the pull-down transistors PD-2 are N-type transistors and the pull-up transistors PU-2 are P-type transistor.

The P-type well regions 110*a*_2 and 110*c* and the N-type well region 110*a*_1 are formed over the substrate 105. The fins 115*c* and 115*d* are formed on the N-type well region 110*a*, the fins 115*a* and 115*b* are formed on the P-type well region 110*c*, and the fins 115*e* and 115*f* are formed on the P-type well region 110*b*. The fins 115*a* through 115*f* are separated from each other by the isolation feature 120 (e.g., the STI).

The gate feature 132 of the gate structures 130*d* and 130*i* is formed over the gate dielectric layer 134 and is positioned over a top surface of the active structures 115*a* through 115*f*. Moreover, the gate end dielectrics 139 are formed on opposite sides of the gate feature 132. Each of the fins 115*a* and 115*b* overlapping the gate feature 132 of the gate structure 130*d* may serve as a channel region of the pull-down transistor PD-2 of the memory cell 10*a*_1, and each of the fins 115*e* and 115*f* overlapping the gate feature 132 of the gate structure 130*i* may serve as a channel region of the pull-down transistor PD-2 of the memory cell 10*a*_2. The fin 115*c* overlapping the gate feature 132 of the gate structure 130*d* may serve as a channel region of the pull-up transistor PU-2 of the memory cell 10*a*_1, and the fin 115*d* overlapping the gate feature 132 of the gate structure 130*i* may serve as a channel region of the pull-up transistor PU-2 of the memory cell 10*a*_2. In some embodiments, the gate feature 132 is made of conductive material, such as aluminum (Al), copper (Cu), tungsten (W), titanium (Ti), tantalum (Ta), or other applicable materials.

The gate dielectric layer 134 may be a single layer or multiple layers. The gate top dielectric layer 138 is over the gate dielectric layer 134 and the gate feature 132.

The gate dielectric layer 134 is made of silicon oxide (SiOx), silicon nitride (SixNy), silicon oxynitride (SiON), dielectric material(s) with high dielectric constant (high-k), or a combination thereof. In some embodiments, the gate dielectric layer 134 is deposited by a plasma enhanced chemical vapor deposition (PECVD) process or by a spin coating process. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material.

The gate via 140*e* is formed over the gate feature 132 of the gate structure 130*d* and extends through the top dielectric layer 138 and the ILD 137. The gate feature 132 of the gate structure 130*d* is electrically connected to the metal line 150*e* through the gate via 140*e*. The gate via 140*i* is formed over the gate feature 132 of the gate structure 130*i* and extends through the top dielectric layer 138 and the ILD 137. The gate feature 132 of the gate structure 130*i* is electrically connected to the metal line 150*i* through the gate via 140*i*.

Figure 5:
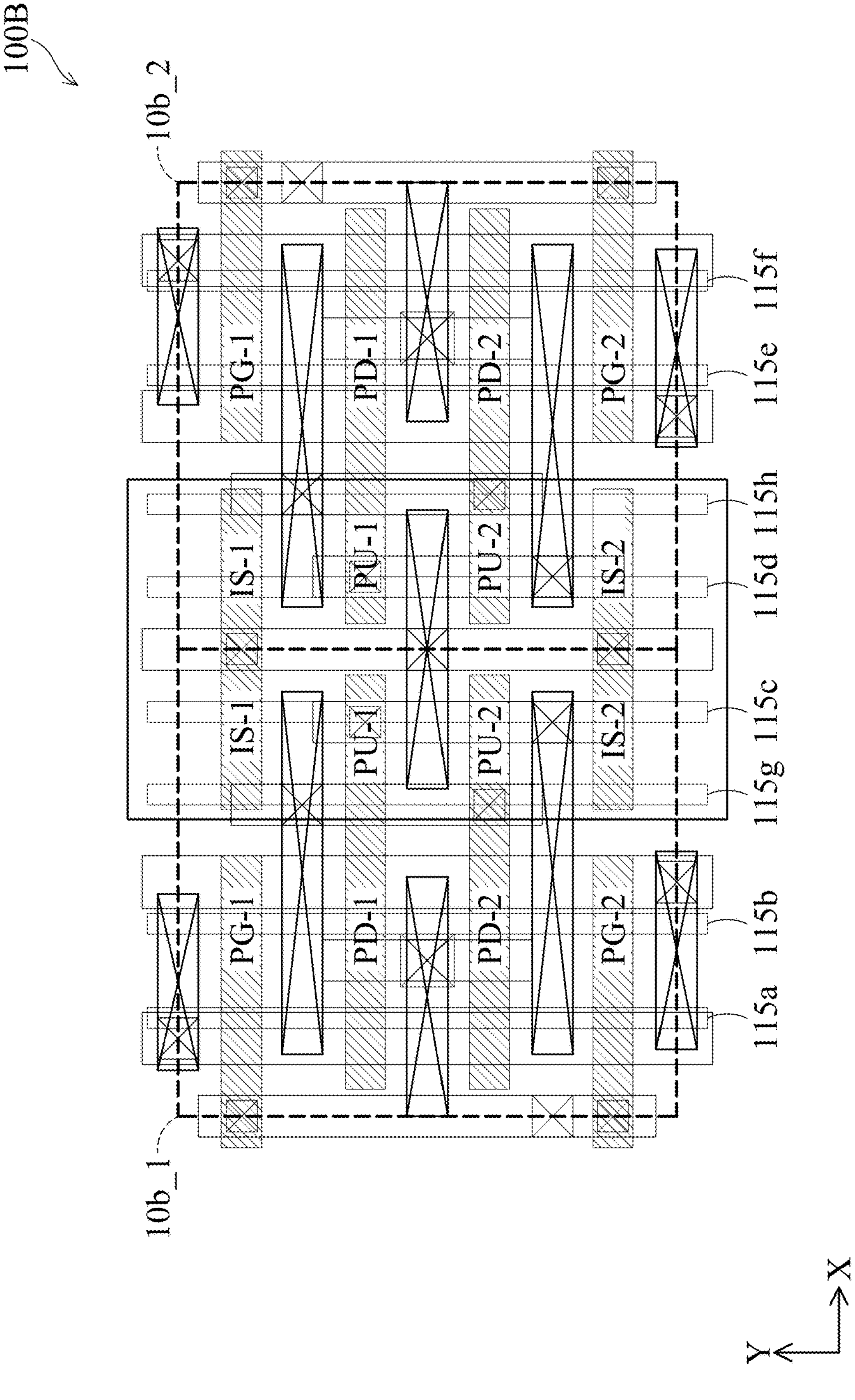
FIG. 5 shows is a top view of two adjacent memory cells in a semiconductor device, with all the depictions regarding components in and under the first metal layer of FIG. 2, in accordance with some embodiments of the disclosure.

FIG. 5 shows is a top view of the memory cells 10*b*_1 and 10*b*_2 in a semiconductor device 100B, with all the depictions regarding components in and under the first metal layer of FIG. 2, in accordance with some embodiments of the disclosure. Components in the memory cells 10*b*_1 and 10*b*_2 that are the same or similar to those in the memory cells 10*a*_1 and 10*a*_2 are given the same reference numbers, and detailed description thereof is thus omitted. Some components of the memory cells 10*b*_1 and 10*b*_2 that are the same or similar to those in the memory cells 10*a*_1 and 10*a*_2 are not labeled for clarity. Moreover, the memory cells 10*b*_1 and 10*b*_2 are an implementation of the memory cell 10 depicted in FIG. 1.

The configuration of the memory cells 10*b*_1 and 10*b*_2 is similar to the configuration of the memory cells 10*a*_1 and 10*a*_2 in FIG. 3A, and the differences between the semiconductor device 100B of FIG. 5 and the semiconductor device 100A of FIG. 3A is that the memory cells 10*b*_1 and 10*b*_2 further include the active regions formed by the fins 115*g* and 115*h* extending along the Y direction. The fins 115*g* and 115*h* are formed in the N-type well region 110*a*.

In FIG. 5, the pull-up transistors PU-1 and PU-2 and the isolation transistors IS-1 and IS-2 of the memory cells 10*b*_1 and 10*b*_2 are the transistors with dual fins. For example, the gate structure 130*c* forms the pull-up transistor PU-1 of the memory cell 10*b*_1 with the underlying fins 115*c* and 115*g* in the N-type well region 110*a*. The gate structure 130*b* forms the isolation transistor IS-1 of the memory cell 10*b*_1 with the underlying fins 115*c* and 115*g* in the N-type well region 110*a*. The gate structure 130*d* forms the pull-up transistor PU-2 of the memory cell 10*b*_1 with the underlying fins 115*c* and 115*g* in the N-type well region 110*a*. The gate structure 130*f* forms the isolation transistor IS-2 of the memory cell 10*b*_1 with the underlying fins 115*c* and 115*g* in the N-type well region 110*a*.

Figure 6A:
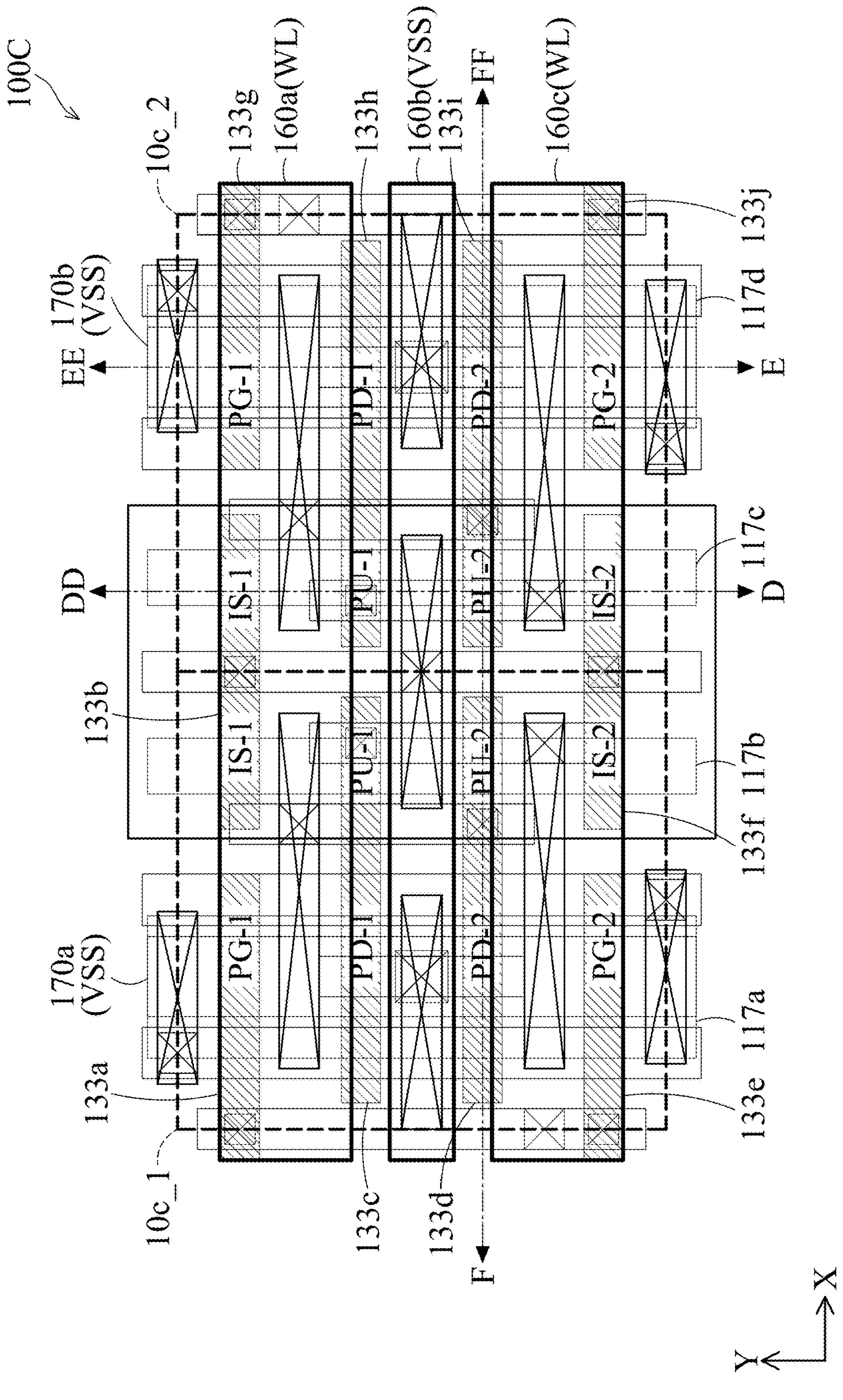
FIG. 6A shows is a top view of two adjacent memory cells in a semiconductor device, with all the depictions regarding components under the third metal layer of FIG. 2, in accordance with some embodiments of the disclosure.

FIG. 6A shows is a top view of the memory cell 10*c*_1 and 10*c*_2 in a semiconductor device 100C, with all the depictions regarding components under the third metal layer of FIG. 2, in accordance with some embodiments of the disclosure. Components in the memory cells 10*c*_1 and 10*c*_2 that are the same or similar to those in the memory cells 10*a*_1 and 10*a*_2 are given the same reference numbers, and detailed description thereof is thus omitted. Some components of the memory cells 10*c*_1 and 10*c*_2 that are the same or similar to those in the memory cells 10*a*_1 and 10*a*_2 are not labeled for clarity. Moreover, the memory cells 10*c*_1 and 10*c*_2 are an implementation of the memory cell 10 depicted in FIG. 1. In this embodiment, the transistors in the memory cells 10*c*_1 and 10*c*_2 are gate-all-around field effect transistors (GAA FETs).

Figure 6B:
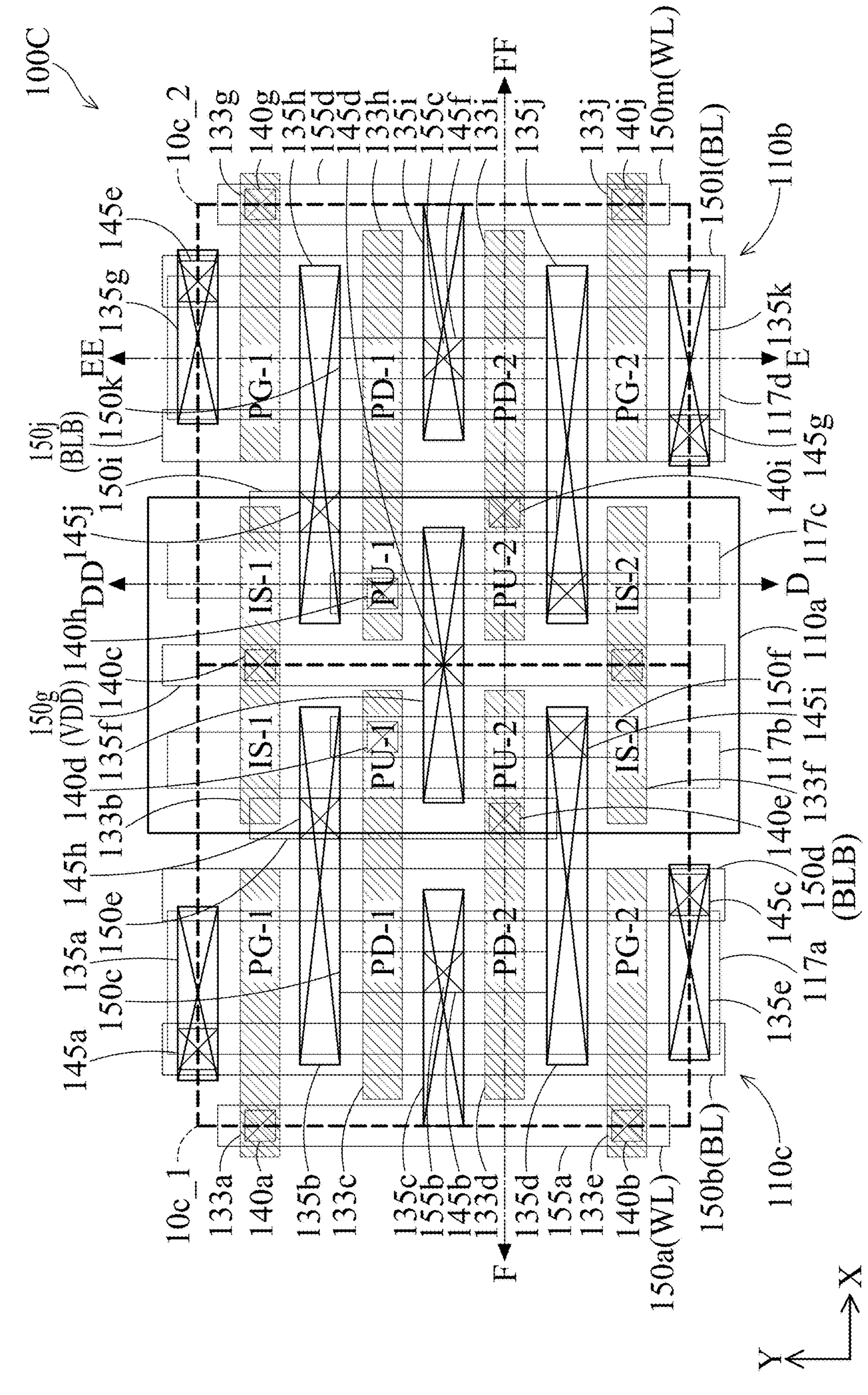
FIG. 6B shows a top view of the memory cells of FIG. 6A, with all the depictions regarding components over the first metal layer of FIG. 2, in accordance with some embodiments of the disclosure.
Figure 6C:
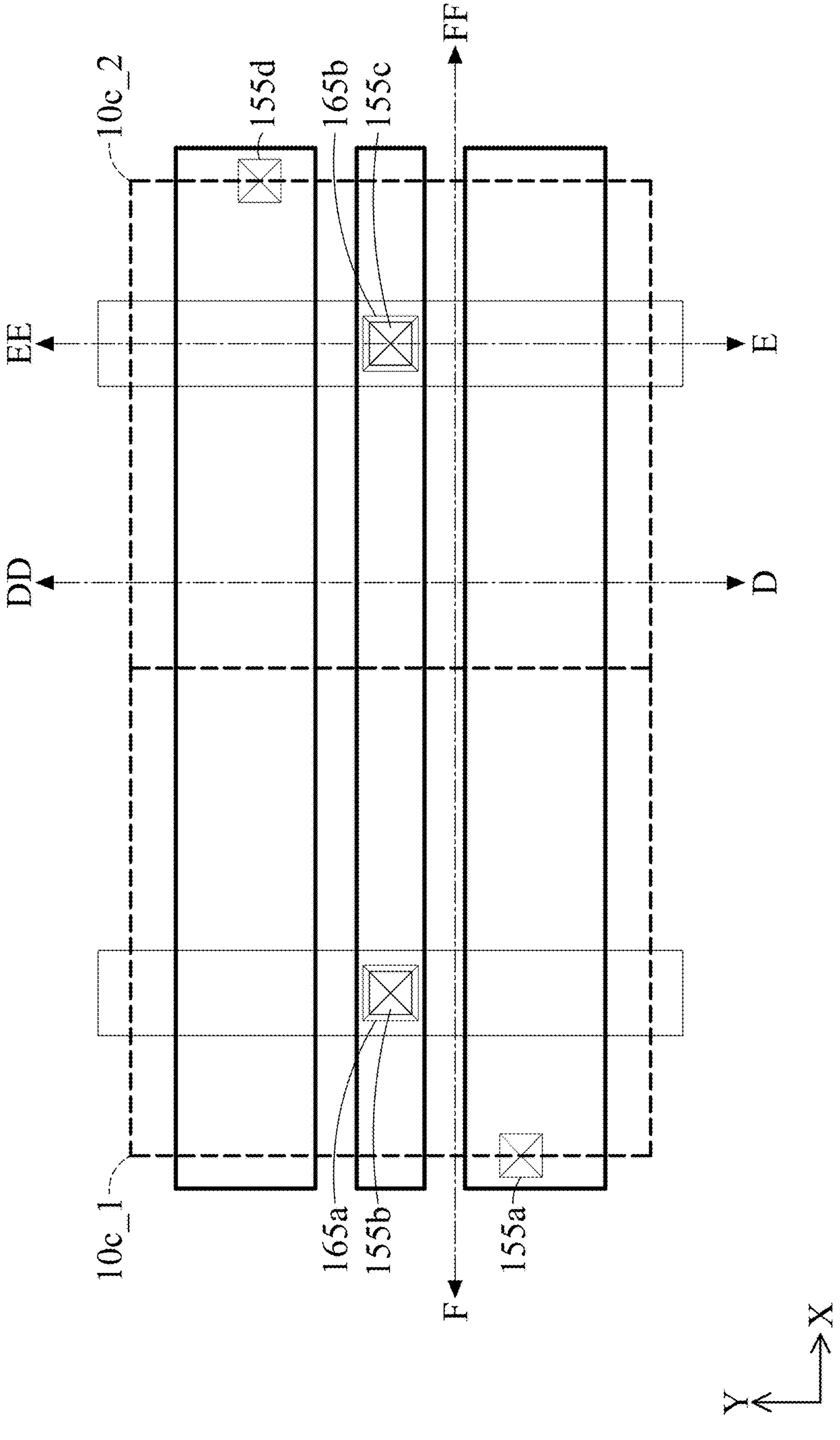
FIG. 6C shows a top view of the memory cells of FIG. 6A, with all the depictions regarding components under the third metal layer.

FIG. 6B shows a top view of the memory cells 10*c*_1 and 10*c*_2 of FIG. 6A, with all the depictions regarding components over the first metal layer of FIG. 2, in accordance with some embodiments of the disclosure. FIG. 6C shows a top view of the memory cells 10*c*_1 and 110*c*_2 of FIG. 6A, with all the depictions regarding components under the third metal layer.

The nanostructure transistor (e.g. nanosheet transistor, nanowire transistor, multi-bridge channel, nano-ribbon FET, gate-all-around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The configuration of the memory cells 10*c*_1 and 10*c*_2 is similar to the configuration of the memory cells 10*a*_1 and 10*a*_2 in FIGS. 3A through 3C, and the differences between the semiconductor device 100C of FIGS. 6A through 6C and the semiconductor device 100A of FIGS. 3A through 3C is that the memory cells 10*c*_1 and 10*c*_2 include the active regions 117*a* through 117*d* extending along the Y-direction. The active region 117*a* is formed in the P-type well region 110*c*, the active regions 117*b* and 117*c* are formed in the N-type well region 110*a*, and the active region 117*d* is formed in the P-type well region 110*b*.

Each of the active regions 117*a* through 117*d* is formed by the nanostructures formed on the substrate. In some embodiments, the nanostructures may also be referred to as channels, channel layers, nanosheets, or nanowires. The nanostructures may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures include silicon for N-type GAA transistors. In other embodiments, the nanostructures include silicon germanium for P-type GAA transistors. In some embodiments, the nanostructures are all made of silicon, and the type of GAA transistors depend on work function metal layer wrapping around the nanostructures.

In the memory cell 10*c*_1, the gate structure 133*a* engages the active region 117*a* to form the pass-gate transistor PG-1. The gate structure 133*b* engages the active region 117*b* to form the isolation transistor IS-1. The gate structure 133*c* engages the active region 117a to form the pull-down transistor PD-1, and the gate structure 133c engages the active region 117b to form the pull-up transistor PU-1. The gate structure 133d engages the active region 117a to form the pull-down transistor PD-2, and the gate structure 133d engages the active region 117b to form the pull-up transistor PU-2. The gate structure 133e engages the active region 117a to form the pass-gate transistor PG-2. The gate structure 133f engages the active region 117b to form the isolation transistor IS-2.

In the memory cell 10c_2, the gate structure 133g engages the active region 117d to form the pass-gate transistor PG-1. The gate structure 133b engages the active region 117c to form the isolation transistor IS-1. The gate structure 133h engages the active region 117d to form the pull-down transistor PD-1, and the gate structure 133h engages the active region 117c to form the pull-up transistor PU-1. The gate structure 133i engages the active region 117d to form the pull-down transistor PD-2, and the gate structure 133i engages the active region 117c to form the pull-up transistor PU-2. The gate structure 133j engages the active region 117d to form the pass-gate transistor PG-2. The gate structure 133f engages the active region 117c to form the isolation transistor IS-2.

The memory cells 10c_1 and 10c_2 have a cell width W2 measurable along the X direction and a cell height H2 measurable along the Y-direction. In some embodiments, the ration of the cell width W2 to the cell height H2 is within a range of about 0.75 to about 1.5. In some embodiments, a memory macro is formed but repeating and abutting memory cells having a configuration identical or mirrored-identical to the memory cells 10c_1 and 10c_2. Thus, the cell width W2 is also referred to as a cell pitch along the X direction, and the cell height H2 is also referred to as a cell pitch along the Y-direction. In some embodiments, the cell height H2 of the memory cells 10c_1 and 10c_2 is equal to the cell height H1 of the memory cells 10a_1 and 10a_2, and the cell width W2 of the memory cells 10c_1 and 10c_2 is equal to the cell width W1 of the memory cells 10a_1 and 10a_2. In this embodiment, the cell height H2 is the same as 4 times the contacted poly pitch (CPP), i.e., 4 times the gate pitch for the gate structures 133a through 133j.

The interconnect configuration of the memory cells 10c_1 and 10c_2 is similar to that of the memory cells 10a_1 and 10a_2 in FIG. 3A. In the first metal layer of the semiconductor device 100C of FIGS. 6A and 6B, the metal line 150g functions as the VDD line for the memory cells 10c_1 and 10c_2. The metal line 150b functions as the bit line BL (e.g., BL conductor) and the metal line 150d functions as the complementary bit line BLB (e.g., BLB conductor) for the memory cell 10c_1. The metal line 150l functions as the bit line BL (e.g., BL conductor) and the metal line 150j functions as the complementary bit line BLB (e.g., BLB conductor) for the memory cell 10c_2.

In the second metal layer of the semiconductor device 100C of FIGS. 6A and 6C, the metal line 160a functions as the word line WL (e.g., a second word line WL) for the memory cell 10c_2. The metal line 160c functions as the word line WL (e.g., a first word line WL) for the memory cell 10c_1. In other words, the adjacent memory cells 10c_1 and 10c_2 arranged in the same row are controlled by the different word lines WL. The metal line 160b functions as the VSS line for the memory cells 10c_1 and 10c_2.

In the third metal layer of the semiconductor device 100C of FIGS. 6A and 6C, the metal line 170a functions as the VSS line for the memory cell 10c_1. The metal line 170b functions as the VSS line for the memory cell 10c_2.

Figure 7A:
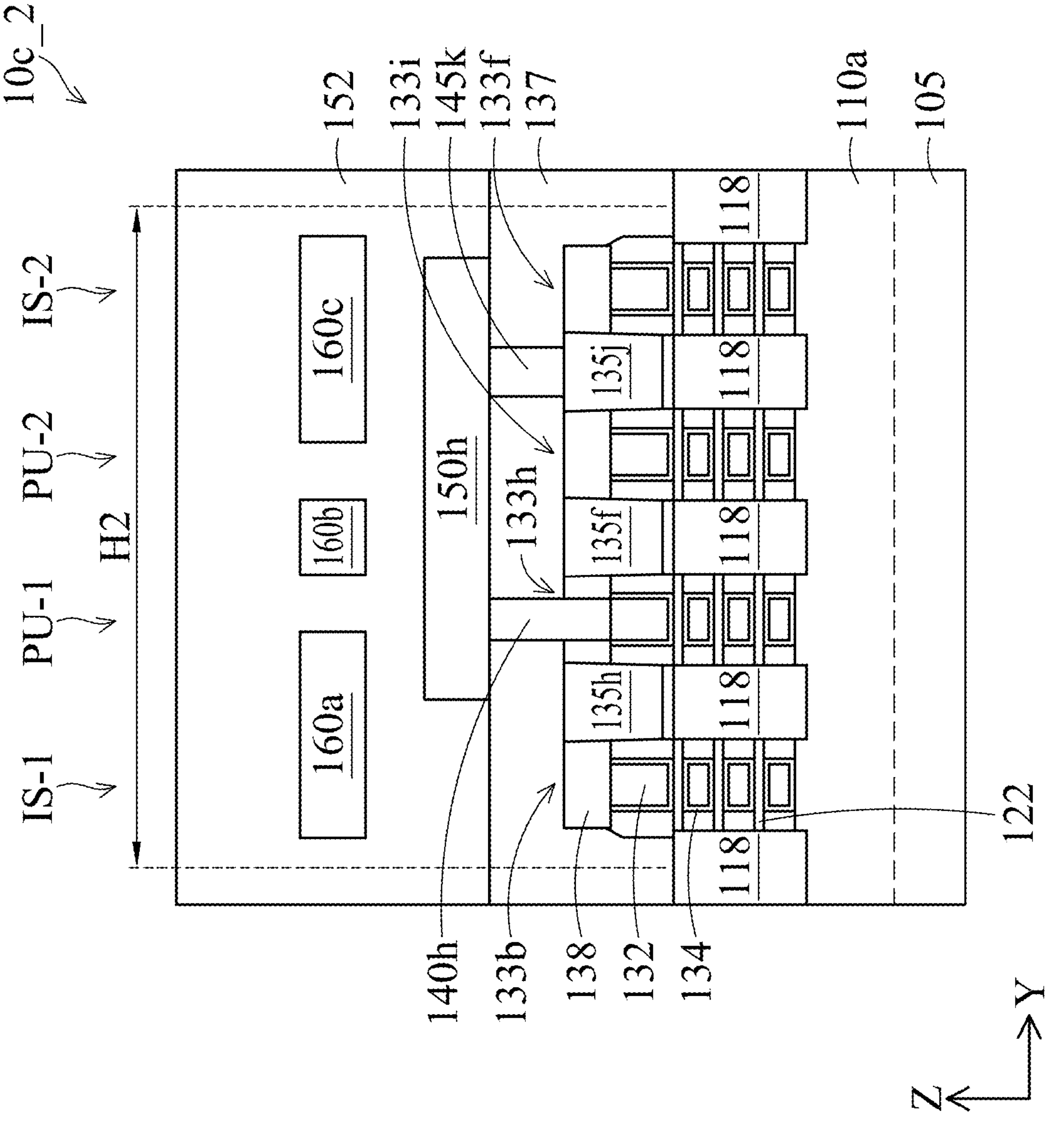
FIG. 7A shows a cross sectional view of the semiconductor device along a line D-DD in FIGS. 6A through 6C, in accordance with some embodiments of the disclosure.

FIG. 7A shows a cross sectional view of the semiconductor device 100C along a line D-DD in FIGS. 6A through 6C, in accordance with some embodiments of the disclosure. As described above, the memory cell 10c_2 has a cell height (or cell pitch) H2 measurable along the Y-direction. In FIG. 7A, the cross sectional view of the pull-up transistors PU-1 and PU-2 and the isolation transistors IS-1 and IS-2 are illustrated, and the pull-up transistors PU-1 and PU-2 and the isolation transistors IS-1 and IS-2 are P-type GAA FETs.

Figure 7B:
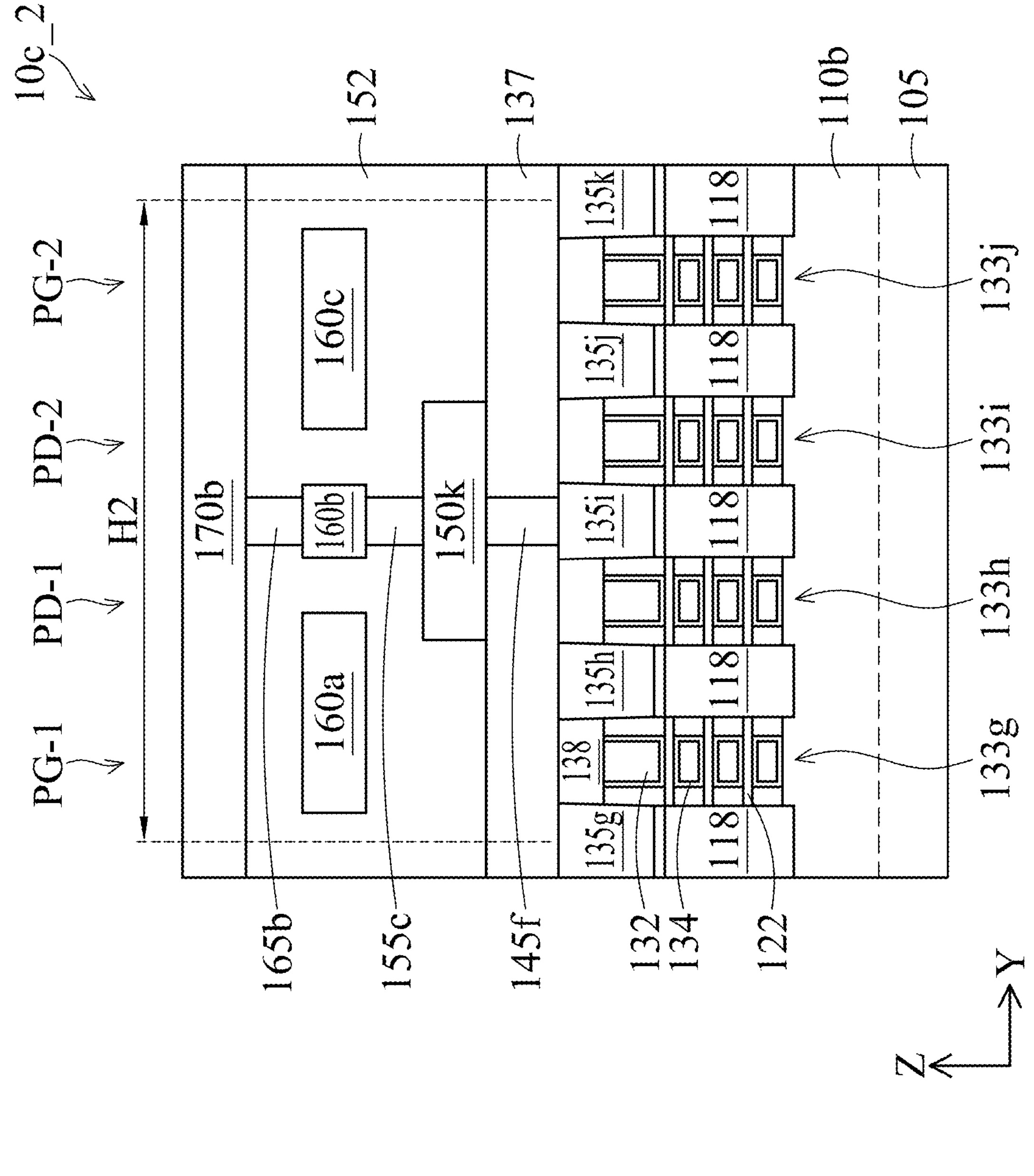
FIG. 7B shows a cross sectional view of the semiconductor device along a line E-EE in FIGS. 6A through 6C, in accordance with some embodiments of the disclosure.

FIG. 7B shows a cross sectional view of the semiconductor device 100C along a line E-EE in FIGS. 6A through 6C, in accordance with some embodiments of the disclosure. As described above, the memory cell 10c_2 has the cell height (or cell pitch) H2 measurable along the Y-direction. In FIG. 7B, the cross sectional view of the pull-down transistors PD-1 and PD-2 and the pass-gate transistors PG-1 and PG-2 of the memory cell 10c_2 are illustrated, and the pull-down transistors PD-1 and PD-2 and the pass-gate transistors PG-1 and PG-2 are N-type GAA FETs.

Figure 7C:
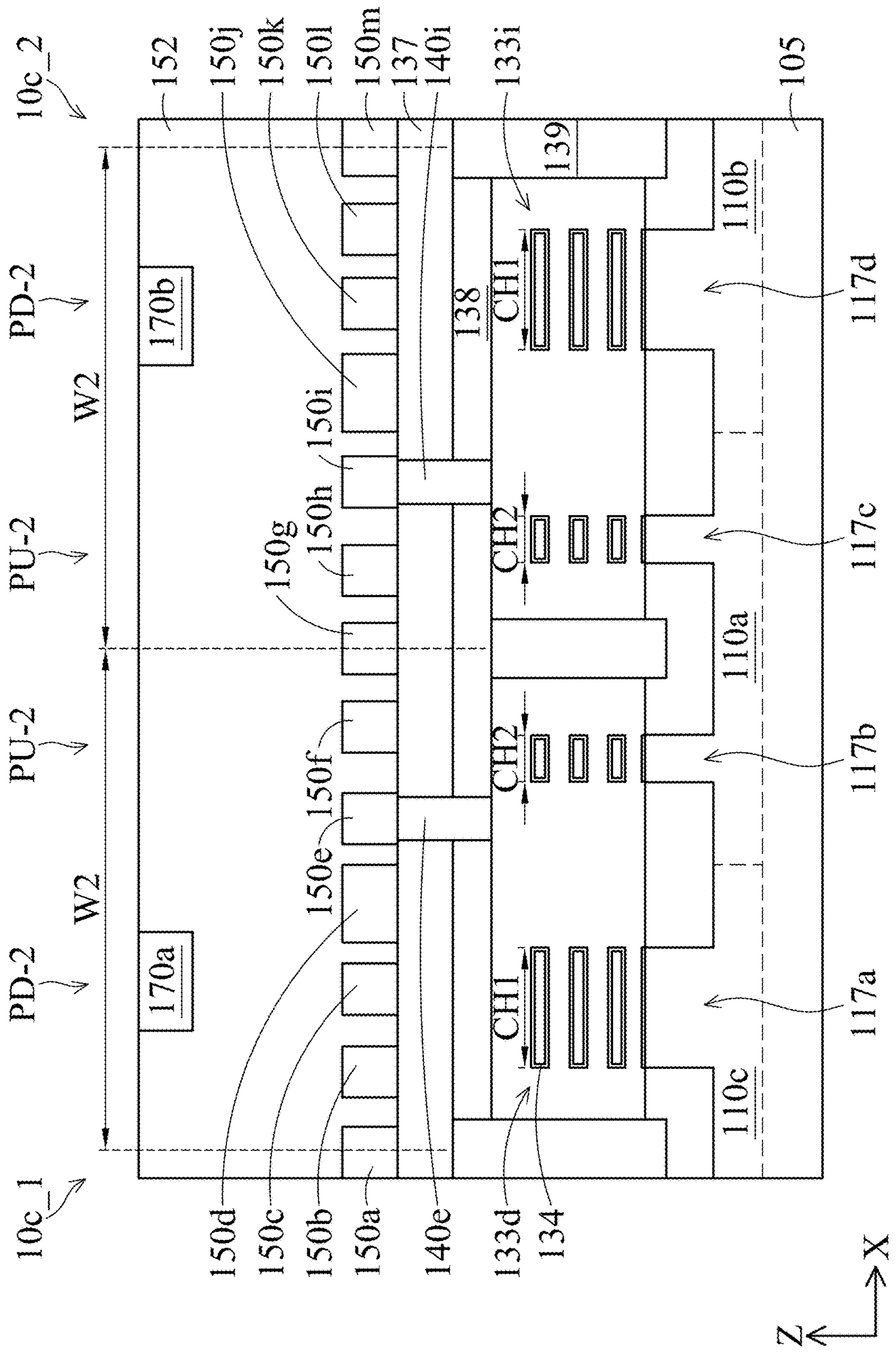
FIG. 7C shows a cross sectional view of the semiconductor device along a line F-FF in FIGS. 6A through 6C, in accordance with some embodiments of the disclosure.

FIG. 7C shows a cross sectional view of the semiconductor device 100C along a line F-FF in FIGS. 6A through 6C, in accordance with some embodiments of the disclosure. As described above, the memory cells 10c_1 and 10c_2 have the cell width (or cell pitch) W2 measurable along the X direction. In FIG. 7C, the cross sectional view of the pull-up transistors PU-2 and the pull-down transistors PD-2 of the memory cells 10c_1 and 10c_2 are illustrated.

As shown in FIGS. 7A through 7C, the gate top dielectric layers 138 are over the gate structures 133a through 133j, the gate spacers 136, and the nanostructures 122. The material of the gate top dielectric layers 138 is discussed above.

The gate spacers 136 are on sidewalls of the gate structures 133a through 133j, as shown in FIGS. 7A and 7B. The gate spacers 136 may include the top spacers and the inner spacers. The top spacers are over the nanostructures 122 and on top sidewalls of the gate structures 133a through 133j. The top spacers may include multiple dielectric materials and be selected from a group consist of SiO2, Si3N4, carbon doped oxide, nitrogen doped oxide, porous oxide, air gap, or a combination thereof. The inner spacers may include a dielectric material having higher K value (dielectric constant) than the top spacers and be selected from a group consisting of silicon nitride (Si3N4), silicon oxide (SiO2), silicon carbide (SiC), silicon oxycarbide (SiOC), silicon oxynitride (SiON), silicon oxycarbon nitride (SiOCN), air gap, or a combination thereof.

The nanostructures 122 are wrapped by the gate structures 133a through 133j to serve as channels or channel layers of the transistors in the memory cells 10c_1 and 10c_2. In FIGS. 7A through 7C, each GAA transistor has three nanostructures 122 vertically arranged (or stacked) in the Z-direction. In other embodiments, each GAA transistor has the more or less nanostructures 122 vertically arranged (or stacked) in the Z-direction.

In the memory cells 10c_1 and 10c_2, the active regions 117a through 117d may have different widths in the X direction. In some embodiments, the widths of the active structures 117a through 117d are determined according to the channel width of the channel width corresponding to the respective nanostructures 122.

As shown in FIG. 7C, the nanostructures 122 of the pull-up transistors PU-2 have a channel width CH2 in the X direction, and the nanostructures 122 of the pull-down transistors PD-2 have a channel width CH1 in the X direction. In such embodiments, the channel width CH1 is greater than the channel width CH2. The dimension ratio of the channel width CH1 to the channel width CH2 is about 1.2 to about 5.

Each source/drain feature 118 is disposed between two adjacent gate structures and contact the nanostructures 122 of the transistors, as shown in FIGS. 7A and 7B. Therefore, each source/drain feature 118 is shared by two adjacent gate structures. In some embodiments, the source/drain features 118 may be also referred to as common source/drain features. As described above, the source/drain features 118 is formed by the epitaxially-grown materials discussed above.

The ILD 137 and the IMD 152 may include one or more dielectric layers including dielectric materials, such as tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof.

In some embodiments, the materials of the source/drain contact, the vias and metal lines in the memory cells 10*c*_1 and 10*c*_2 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

Figure 8:
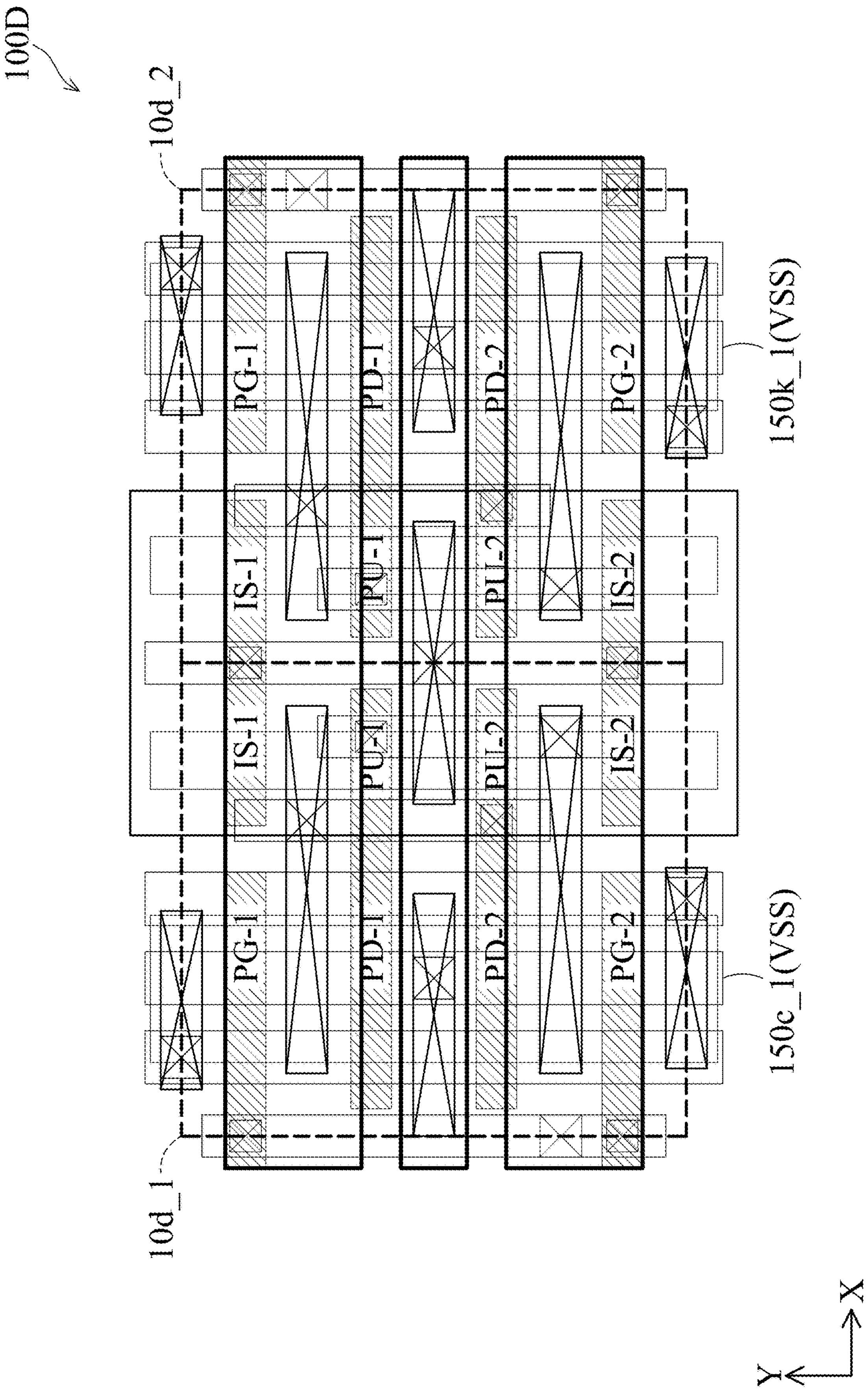
FIG. 8 shows is a top view of the two adjacent memory cells in a semiconductor device, with all the depictions regarding components in and under the first metal layer of FIG. 2, in accordance with some embodiments of the disclosure.

FIG. 8 shows is a top view of the memory cells 10*d*_1 and 10*d*_2 in a semiconductor device 100D, with all the depictions regarding components in and under the first metal layer of FIG. 2, in accordance with some embodiments of the disclosure. Components in the memory cells 10*d*_1 and 10*d*_2 that are the same or similar to those in the memory cells 10*c*_1 and 10*c*_2 are given the same reference numbers, and detailed description thereof is thus omitted. Some components of the memory cells 10*d*_1 and 10*d*_2 that are the same or similar to those in the memory cells 10*c*_1 and 10*c*_2 are not labeled for clarity. Moreover, the memory cells 10*d*_1 and 10*d*_2 are an implementation of the memory cell 10 depicted in FIG. 1. In this embodiment, the transistors in the memory cells 10*d*_1 and 10*d*_2 are GAA FETs. In some embodiments, the transistors in the memory cells 10*d*_1 and 10*d*_2 are FinFETs.

The configuration of the semiconductor device 100D is similar to the configuration of the semiconductor device 100C in FIGS. 6A and 6B, and the difference between the memory cells 10*d*_1 and 10*d*_2 of FIG. 8 and the memory cells 10*c*_1 and 10*c*_2 of FIG. 6B is that the metal lines 150*c*_1 and 150*k*_1 are continuous lines that extend across the memory cells 10*d*_1 and 10*d*_2, respectively. Compared with the metal lines 150*c* and 150*k* in FIGS. 6A and 6B, the metal lines 150*c*_1 and 150*k*_1 function as the VSS contactors for the memory cells 10*d*_1 and 10*d*_2. Furthermore, the memory cells arranged in the same column as the memory cell 10*d*_1 share the same VSS line through the metal line 150*c*_1 in the first metal layer. Similarly, the memory cells arranged in the same column as the memory cell 10*d*_2 share the same VSS line through the metal line 150*k*_1 in the first metal layer.

Figure 9:
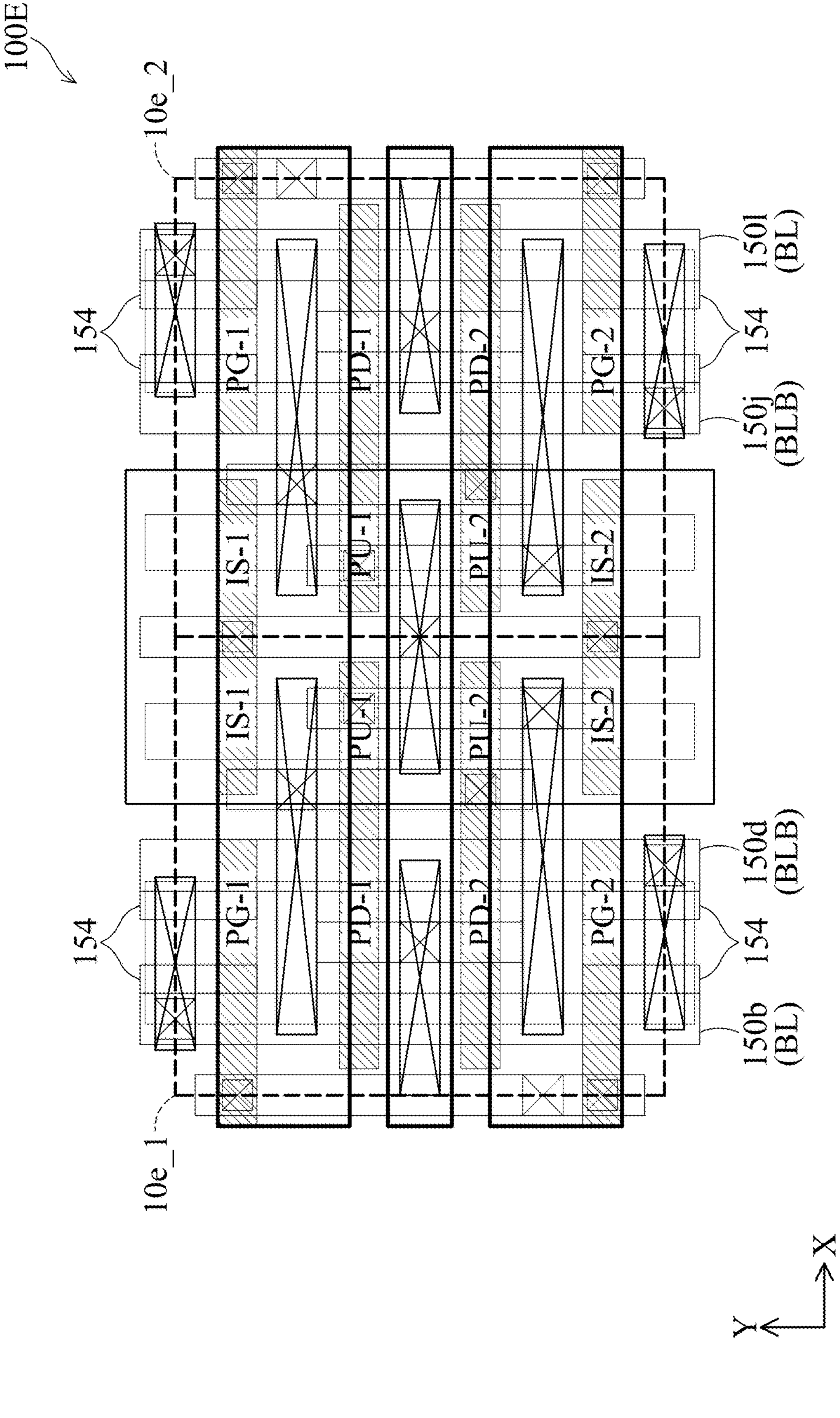
FIG. 9 shows is a top view of the two adjacent memory cells in a semiconductor device, with all the depictions regarding components in and under the first metal layer of FIG. 2, in accordance with some embodiments of the disclosure.

FIG. 9 shows is a top view of the memory cells 10*e*_1 and 10*e*_2 in a semiconductor device 100E, with all the depictions regarding components in and under the first metal layer of FIG. 2, in accordance with some embodiments of the disclosure. Components in the memory cells 10*e*_1 and 10*e*_2 that are the same or similar to those in the memory cells 10*c*_1 and 10*c*_2 are given the same reference numbers, and detailed description thereof is thus omitted. Some components of the memory cells 10*e*_1 and 10*e*_2 that are the same or similar to those in the memory cells 10*c*_1 and 10*c*_2 are not labeled for clarity. Moreover, the memory cells 10*e*_1 and 10*e*_2 are an implementation of the memory cell 10 depicted in FIG. 1. In this embodiment, the transistors in the memory cells 10*e*_1 and 10*e*_2 are GAA FETs. In some embodiments, the transistors in the memory cells 10*e*_1 and 10*e*_2 are FinFETs.

The configuration of the semiconductor device 100E is similar to the configuration of the semiconductor device 100C in FIGS. 6A and 6B, and the differences between the memory cells 10*e*_1 and 10*e*_2 of FIG. 9 and the memory cells 10*c*_1 and 10*c*_2 of FIG. 6B is that the metal lines 150*b*, 150*d*, 150*j* and 150*l* have the extra portions (e.g., a metal jog) 154 extending in the Y direction. In other words, the bit lines BL (e.g., the metal lines 150*b* and 150*l*) and the complementary bit lines BLB (e.g., the metal lines 150*d* and 150*j*) have the extra portions 154 at cell boundaries of the memory cells 10*e*_1 and 10*e*_2, so as to decrease the resistances of the bit lines BL and the complementary bit lines BLB. In some embodiments, a width of the extra portion 154 is about 3 nm to 20 nm in the X direction. In some embodiments, the extra portions 154 are curved, rectangular, or elongated. Moreover, in each of the memory cells 10*e*_1 and 10*e*_2, the extra portions 154 of the bit lines BL face the extra portions 154 of the complementary bit lines BLB.

Figure 10:
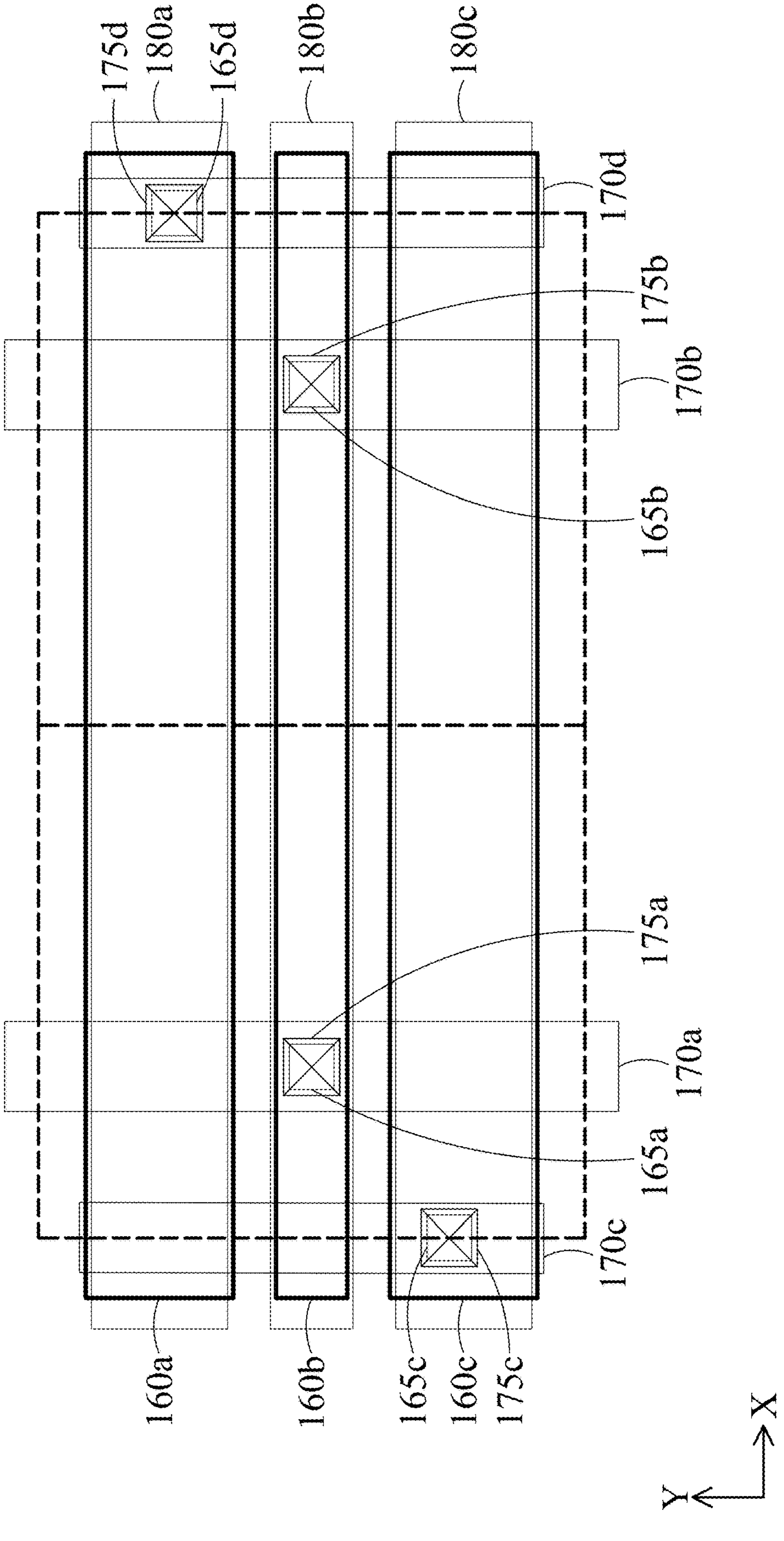
FIG. 10 shows a top view of a semiconductor device, with all the depictions regarding components under the first metal layer, in accordance with some embodiments of the disclosure.

FIG. 10 shows a top view of a semiconductor device (e.g. the semiconductor device 100A, 100B, 100C, 100D or 100E), with all the depictions regarding components under the first metal layer, in accordance with some embodiments of the disclosure.

In the second metal layer of FIG. 10, the metal line 160*a* functions as the word line WL for the memory cell on the right (e.g., the memory cell 10*a*_2, 10*b*_2, 10*c*_2, 10*d*_2 or 10*e*_2). The metal line 160*c* functions as the word line WL for the memory cell on the left (e.g., the memory cell 10*a*_1, 10*b*_1, 10*c*_1, 10*d*_1 or 10*e*_1). The metal line 160*b* functions as the VSS line for the two memory cells.

In the third metal layer of FIG. 10, the metal line 170*a* is electrically connected to the metal line 160*b* through the via 165*a*, and functions as the VSS line for the memory cell on the left. The metal line 170*b* is electrically connected to the metal line 160*b* through the via 165*b*, and functions as the VSS line for the memory cell on the right. The metal line 170*c* is electrically connected to the metal line 160*c* through the via 165*c*, and functions as a landing pad of the word line WL for the memory cell on the left. The metal line 170*d* is electrically connected to the metal line 160*a* through the via 165*d*, and functions as a landing pad of the word line WL for the memory cell on the right.

In the fourth metal layer of FIG. 10, the metal line 180*a* is electrically connected to the metal line 170*d* through the via 175*d*, and functions as the word line WL for the memory cell on the right. The metal line 180*b* is electrically connected to the metal lines 170*a* and 170*b* through the vias 175*a* and 175*b*, and functions as the VSS line for the two memory cells. The metal line 180*c* is electrically connected to the metal line 170*c* through the via 175*c*, and functions as the word line WL for the memory cell on the left.

In FIG. 10, for each memory cell, the double word lines WL (e.g., the word lines in the second and fourth metal layers) are used so as to decrease the resistance of the word lines WL.

Figure 11A:
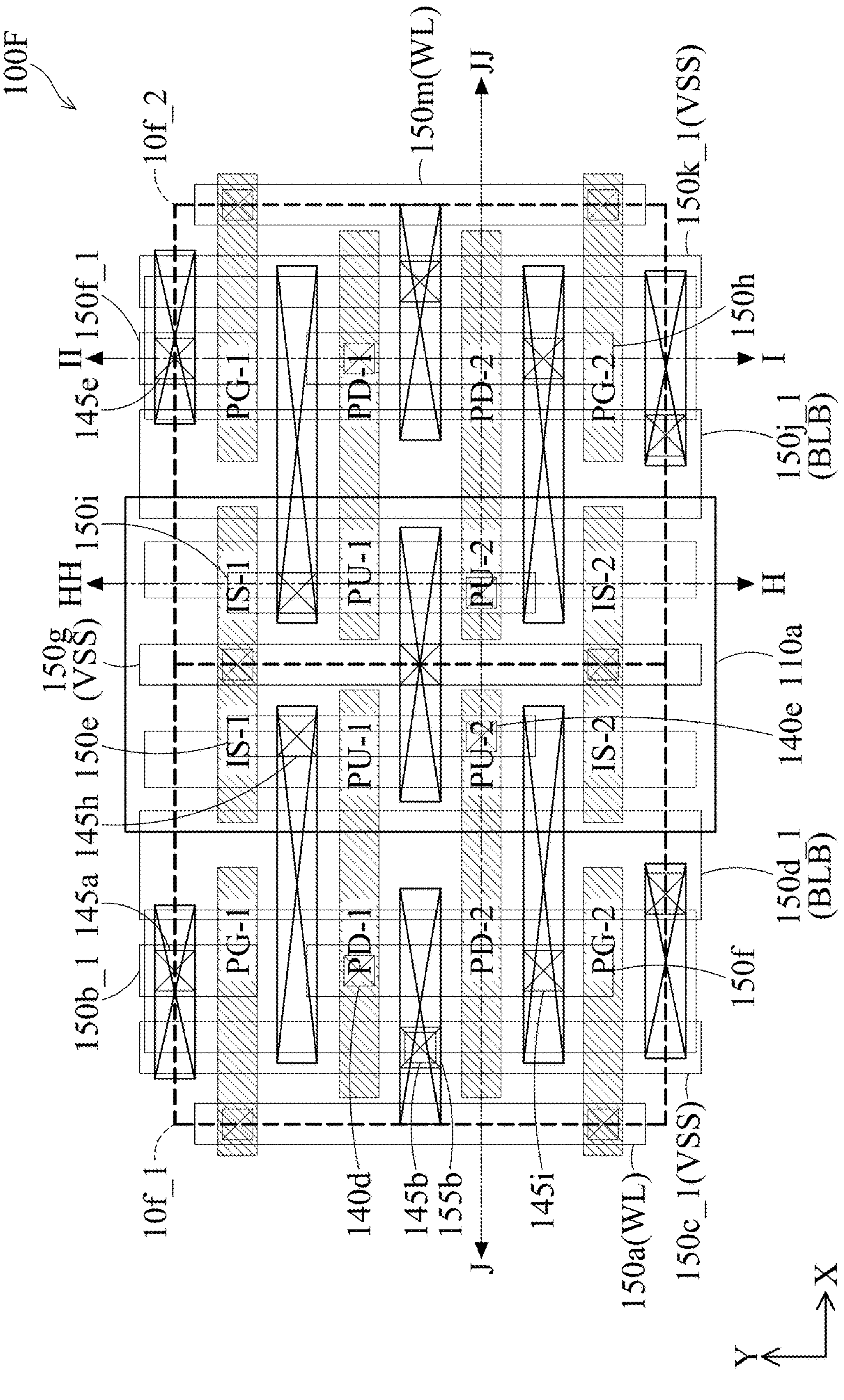
FIG. 11A shows a top view of the two adjacent memory cells in a semiconductor device, with all the depictions regarding components in and under the first metal layer of FIG. 2, in accordance with some embodiments of the disclosure.
Figure 11B:
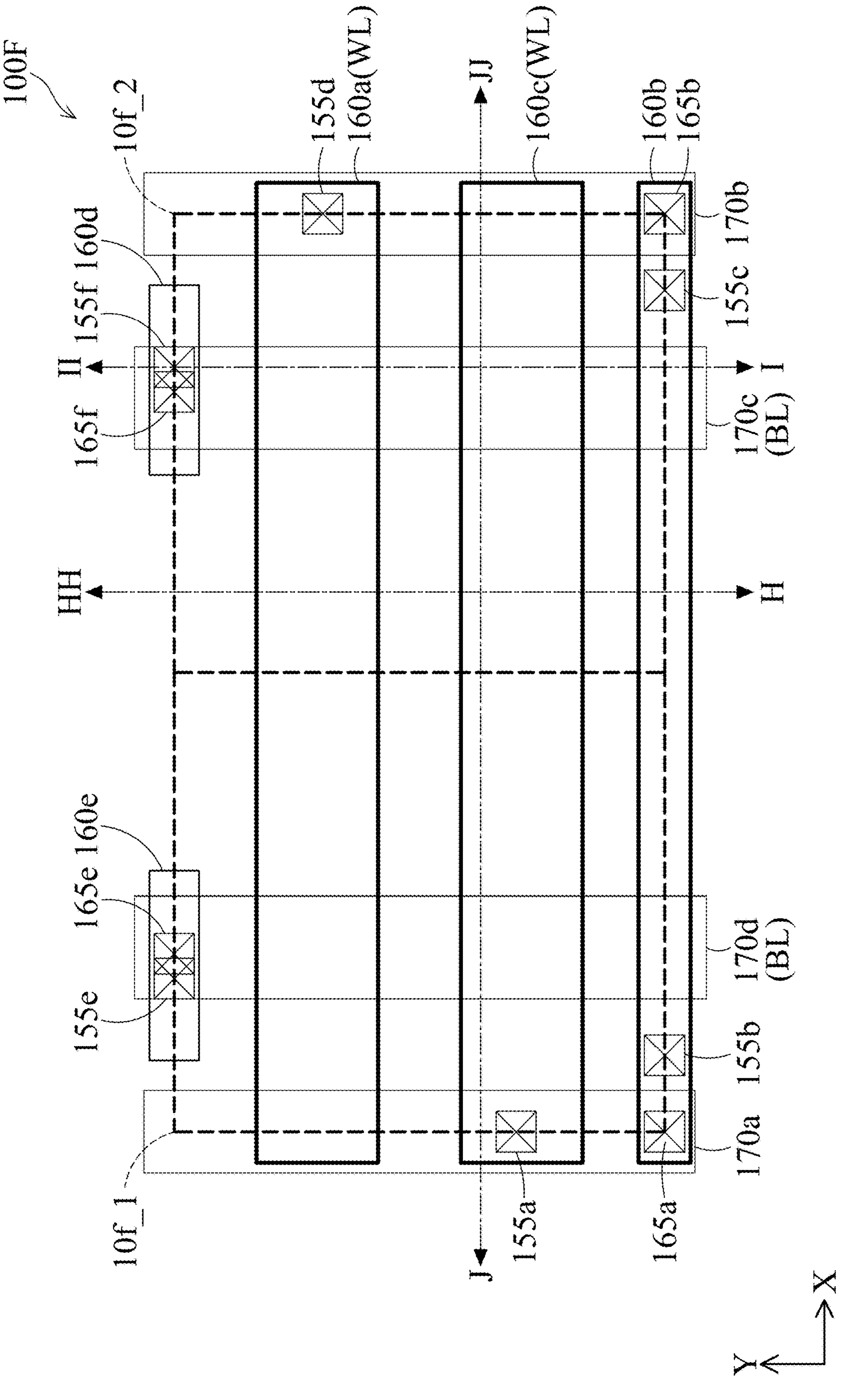
FIG. 11B shows a top view of the memory cells of FIG. 11A, with all the depictions regarding components over the first metal layer.
Figure 11C:
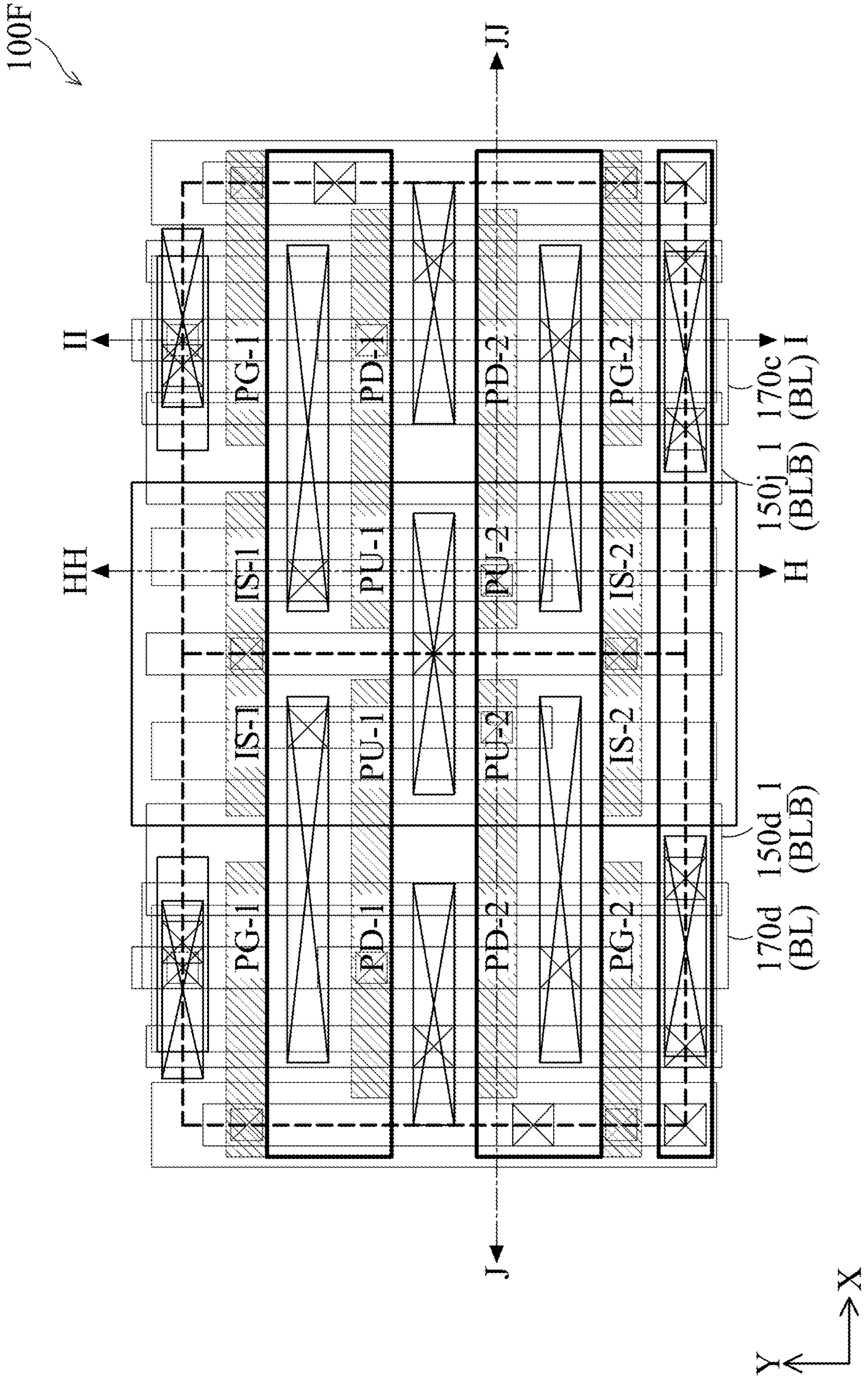
FIG. 11C shows a top view of the memory cells of FIG. 11A, with all the depictions regarding components under the third metal layer.

FIG. 11A shows a top view of the memory cells 10*f*_1 and 10*f*_2 in a semiconductor device 100F, with all the depictions regarding components in and under the first metal layer of FIG. 2, in accordance with some embodiments of the disclosure. FIG. 11B shows a top view of the memory cells 10*f*_1 and 10*f*_2 of FIG. 11A, with all the depictions regarding components over the first metal layer. FIG. 11C shows a top view of the memory cells 10*f*_1 and 10*f*_2 of FIG. 11A, with all the depictions regarding components under the third metal layer.

Components in the memory cells 10*f*_1 and 10*f*_2 that are the same or similar to those in the memory cells 10*c*_1 and 10*c*_2 are given the same reference numbers, and detailed description thereof is thus omitted. Some components of the memory cells 10*f*_1 and 10*f*_2 that are the same or similar to those in the memory cells 10*c*_1 and 10*c*_2 are not labeled for clarity. Moreover, the memory cells 10*f*_1 and 10*f*_2 are an implementation of the memory cell 10 depicted in FIG. 1. In this embodiment, the transistors in the memory cells 10*f*_1 and 10*f*_2 are GAA FETs. In some embodiments, the transistors in the memory cells 10*f*_1 and 10*f*_2 are FinFETs.

The interconnect configuration of the bit lines BL and the complementary bit lines BLB of the memory cells 10*f*_1 and 10*f*_2 is different from that of the previously described memory cells.

As described above, the metal lines 150*c*_1 and 150*k*_1 are continuous lines that extend across the memory cells 10*f*_1 and 10*f*_2, respectively. Furthermore, the metal lines 150*c*_1 and 150*k*_1 function as the VSS contactors for the memory cells 10*f*_1 and 10*f*_2. The metal line 150*c*_1 is close to the metal line 150*a* (the landing pad of the word line WL) in the memory cell 10*f*_1, and the metal line 150*k*_1 is close to the metal line 150*m* (the landing pad of the word line WL) in the memory cell 10*f*_2.

The metal line 150*d*_1 functions as the complementary bit line BLB for the memory cell 10*f*_1, and the metal line 150*j*_1 functions as the complementary bit line BLB for the memory cell 10*f*_2. The metal lines 150*d*_1 and 150*j*_1 are wider than other metal lines in the first metal layer. In this embodiment, the metal line 150*d*_1 is over the N-type well region 110*a* and the P-type well regions 110*c*, and extends along the interface between the N-type well region 110*a* and the P-type well region 110*c*. Moreover, the metal line 150*j*_1 is over the N-type well region 110*a* and the P-type well regions 110*b*, and extends along the interface between the N-type well region 110*a* and the P-type well region 110*b*. In some embodiments, the metal lines 150*d*_1 and 150*j*_1 have the extra portions (e.g., a metal jog) 154.

In the memory cell 10*f*_1, the metal line 150*b*_1 functions as a landing pad of the bit line BL. The metal line 150*b*_1 is electrically connected to the metal line 160*e* of the second metal layer through the via 155*e*. Similarly, the metal line 160*e* functions as a landing pad of the bit line BL. The metal line 160*e* is further electrically connected to the metal line 170*d* of the third metal layer through the via 165*e*. The metal line 170*d* functions as the bit line BL (e.g., BL conductor).

In the memory cell 10*f*_2, the metal line 150*f*_1 functions as a landing pad of the bit line BL. The metal line 150*f*_1 is electrically connected to the metal line 160*d* of the second metal layer through the via 155*f*. Similarly, the metal line 160*d* functions as a landing pad of the bit line BL. The metal line 160*d* is further electrically connected to the metal line 170*c* of the third metal layer through the via 165*f*. The metal line 170*c* functions as the bit line BL (e.g., BL conductor).

In some embodiments, the width of the metal lines 170*d* and 170*c* (i.e., the bit line BL) is the same as the width of the metal lines 150*d*_1 and 150*j*_1 (i.e., the complementary bit line BLB). Furthermore, the metal line 170*d* partially overlaps the metal line 150*d*_1, and the metal line 170*c* partially overlaps the metal line 150*j*_1. The metal lines 170*c* and 170*d* are wider than other metal lines in the third metal layer.

In the second metal layer of the semiconductor device 100F, the metal line 160*a* functions as the word line WL (e.g., a second word line WL) for the memory cell 10*f*_2. The metal line 160*c* functions as the word line WL (e.g., a first word line WL) for the memory cell 10*f*_1. In other words, the adjacent memory cells 10*f*_1 and 10*f*_2 arranged in the same row are controlled by the different word lines WL. The metal line 160*b* functions as the VSS line for the memory cells 10*f*_1 and 10*f*_2. The metal line 160*a* is adjacent to the metal line 160*c*. In other words, the word lines WL of the memory cells 10*f*_1 and 10*f*_2 are not separated by the VSS line.

Figure 12A:
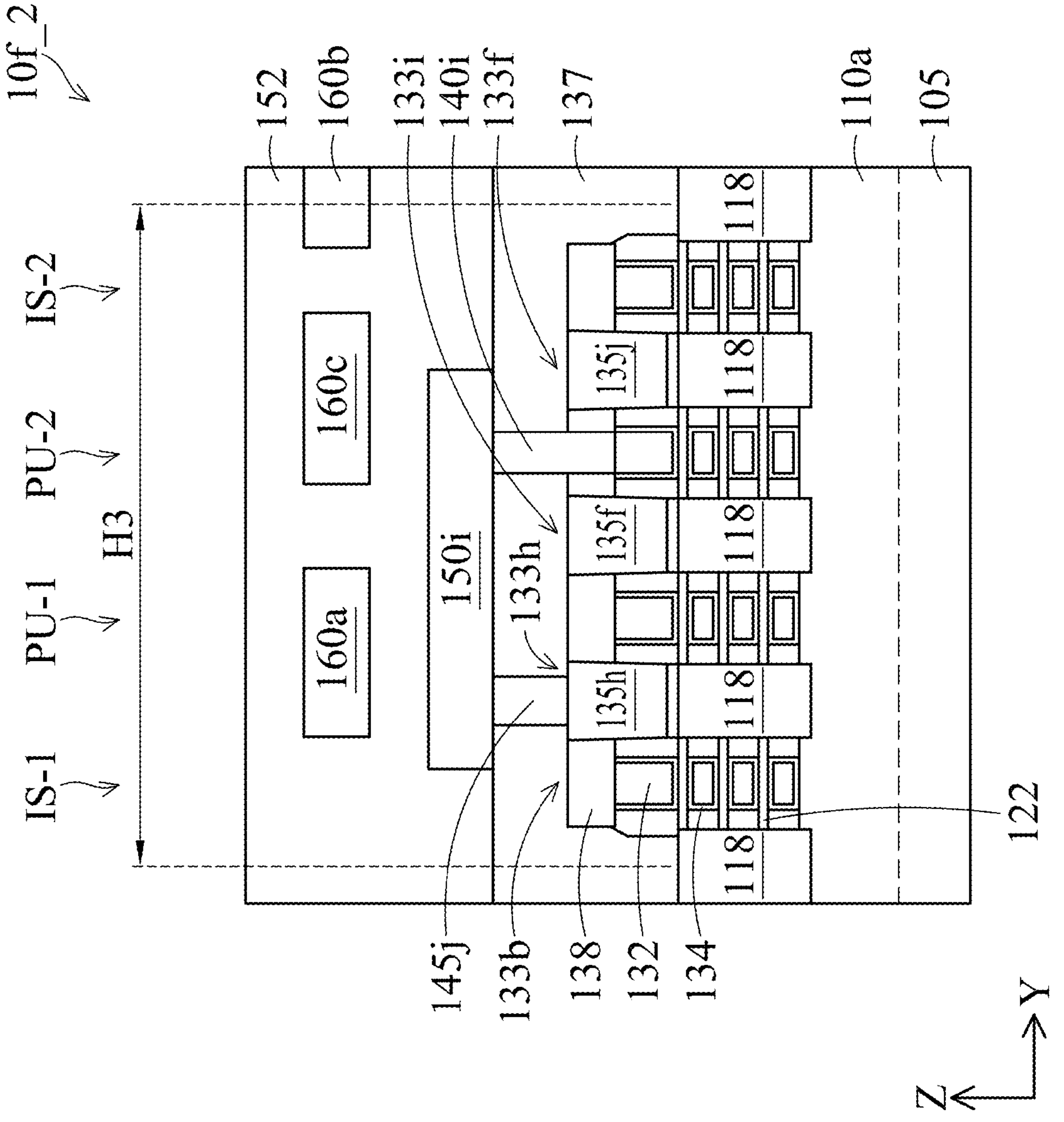
FIG. 12A shows a cross sectional view of the semiconductor device along a line H-HH in FIGS. 11A through 11C, in accordance with some embodiments of the disclosure.

FIG. 12A shows a cross sectional view of the semiconductor device 100F along a line H-HH in FIGS. 11A through 11C, in accordance with some embodiments of the disclosure. As described above, the memory cell 10*f*_2 has a cell height (or cell pitch) H3 measurable along the Y-direction. In FIG. 12A, the cross sectional view of the pull-up transistors PU-1 and PU-2 and the isolation transistors IS-1 and IS-2 are illustrated, and the pull-up transistors PU-1 and PU-2 and the isolation transistors IS-1 and IS-2 are P-type GAA FETs.

Figure 12B:
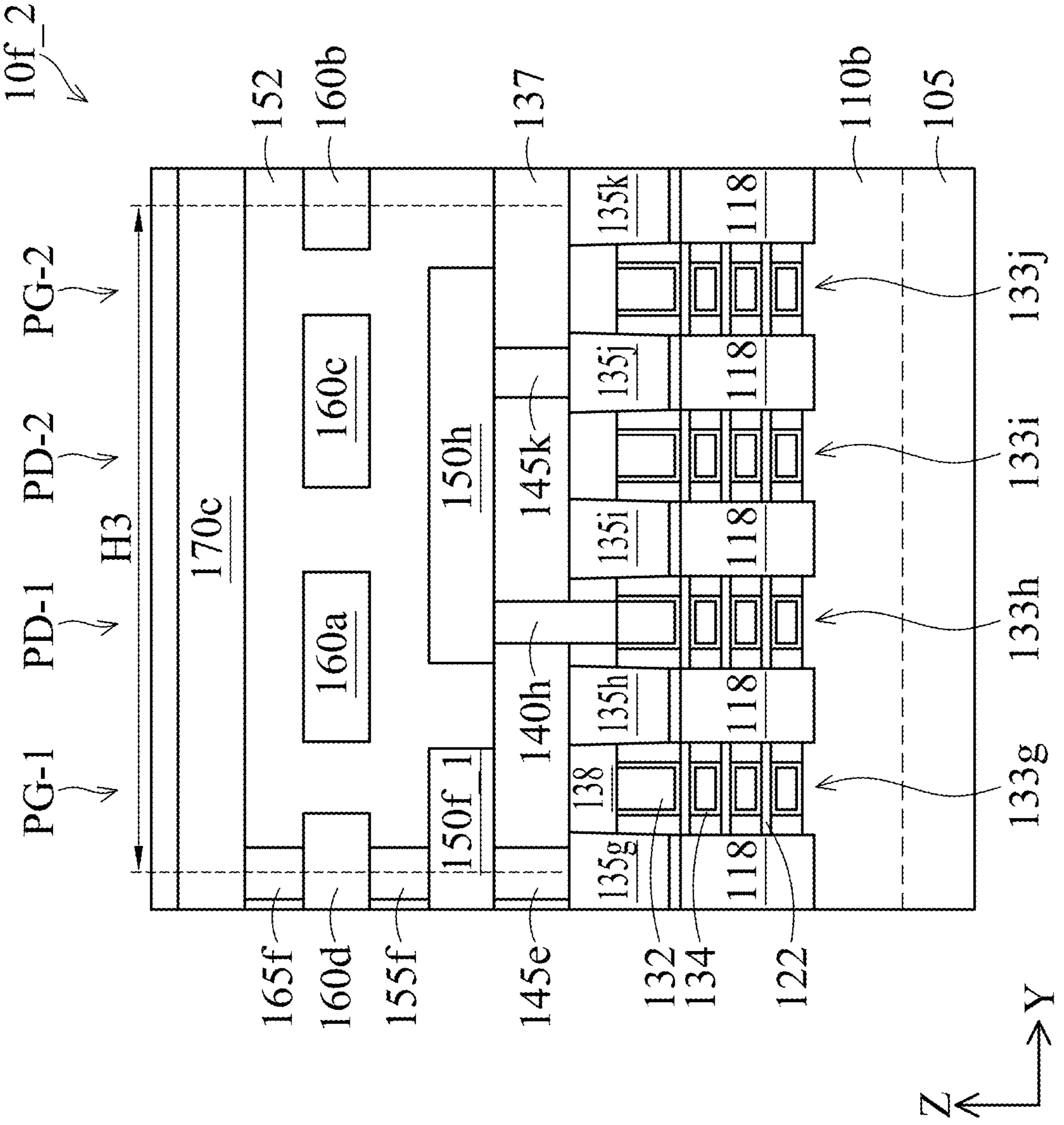
FIG. 12B shows a cross sectional view of the semiconductor device along a line I-II in FIGS. 11A through 11C, in accordance with some embodiments of the disclosure.

FIG. 12B shows a cross sectional view of the semiconductor device 100F along a line I-II in FIGS. 11A through 11C, in accordance with some embodiments of the disclosure. As described above, the memory cell 10*f*_2 has the cell height (or cell pitch) H3 measurable along the Y-direction. In FIG. 12B, the cross sectional view of the pull-down transistors PD-1 and PD-2 and the pass-gate transistors PG-1 and PG-2 of the memory cell 10*c*_2 are illustrated, and the pull-down transistors PD-1 and PD-2 and the pass-gate transistors PG-1 and PG-2 are N-type GAA FETs.

Figure 12C:
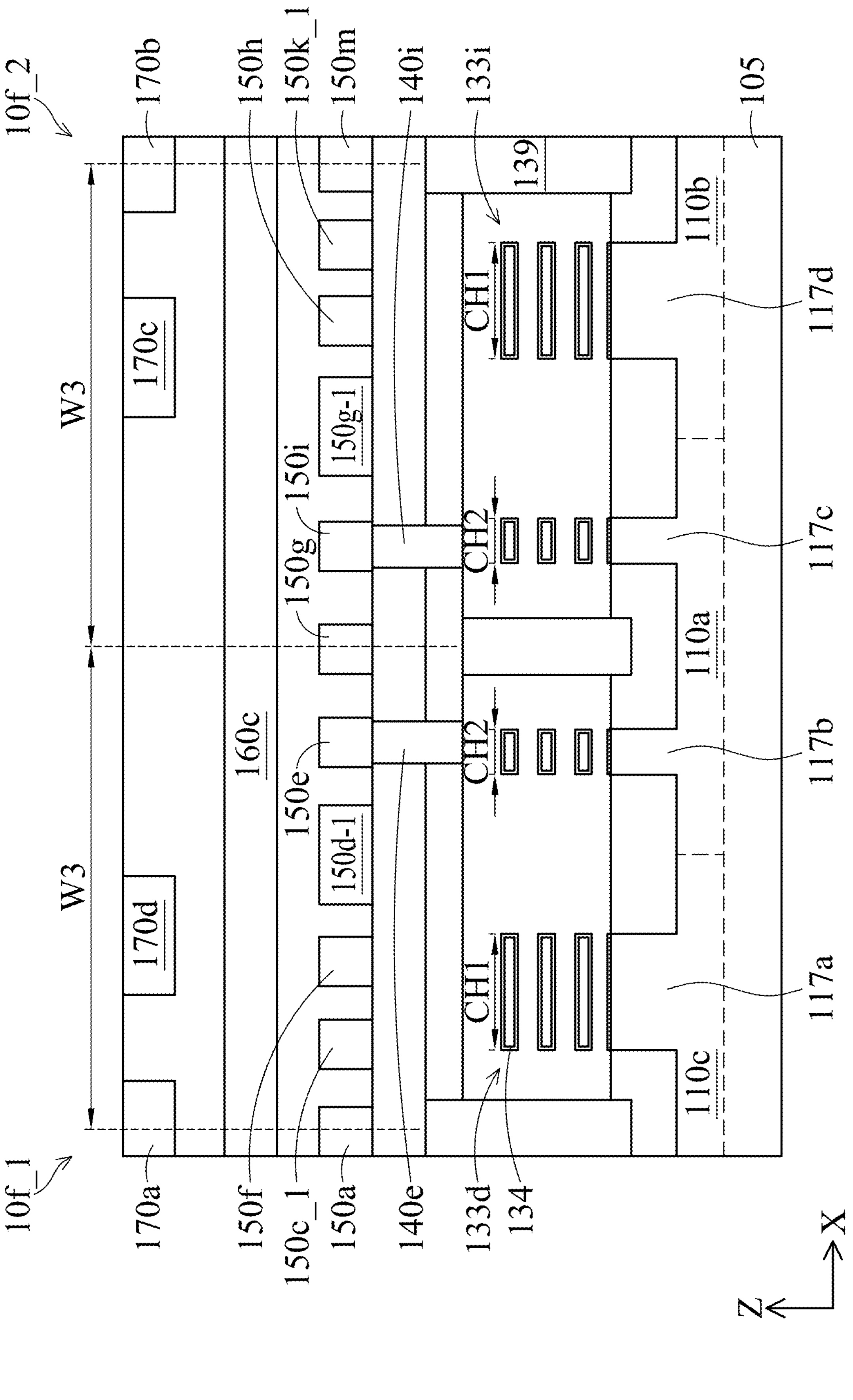
FIG. 12C shows a cross sectional view of the semiconductor device along a line J-JJ in FIGS. 6A through 6C, in accordance with some embodiments of the disclosure.

FIG. 12C shows a cross sectional view of the semiconductor device 100F along a line J-JJ in FIGS. 6A through 6C, in accordance with some embodiments of the disclosure. As described above, the memory cells 10*f*_1 and 10*f*_2 have the cell width (or cell pitch) W3 measurable along the X direction. In FIG. 12C, the cross sectional view of the pull-up transistors PU-2 and the pull-down transistors PD-2 of the memory cells 10*f*_1 and 10*f*_2 are illustrated.

In this embodiment, the cell height H3 is the same as 4 times the contacted poly pitch (CPP). In some embodiments, the ration of the cell width W3 to the cell height H3 is within a range of about 0.75 to about 1.5. In some embodiments, the cell height H3 of the memory cells 10*f*_1 and 10*f*_2 is equal to the cell height H1 of the memory cells 10*a*_1 and 10*a*_2 and the cell height H2 of the memory cells 10*c*_1 and 10*c*_2. Moreover, the cell width W3 of the memory cells 10*f*_1 and 10*f*_2 is equal to the cell width W1 of the memory cells 10*a*_1 and 10*a*_2 and the cell width W2 of the memory cells 10*c*_1 and 10*c*_2.

Figure 13:
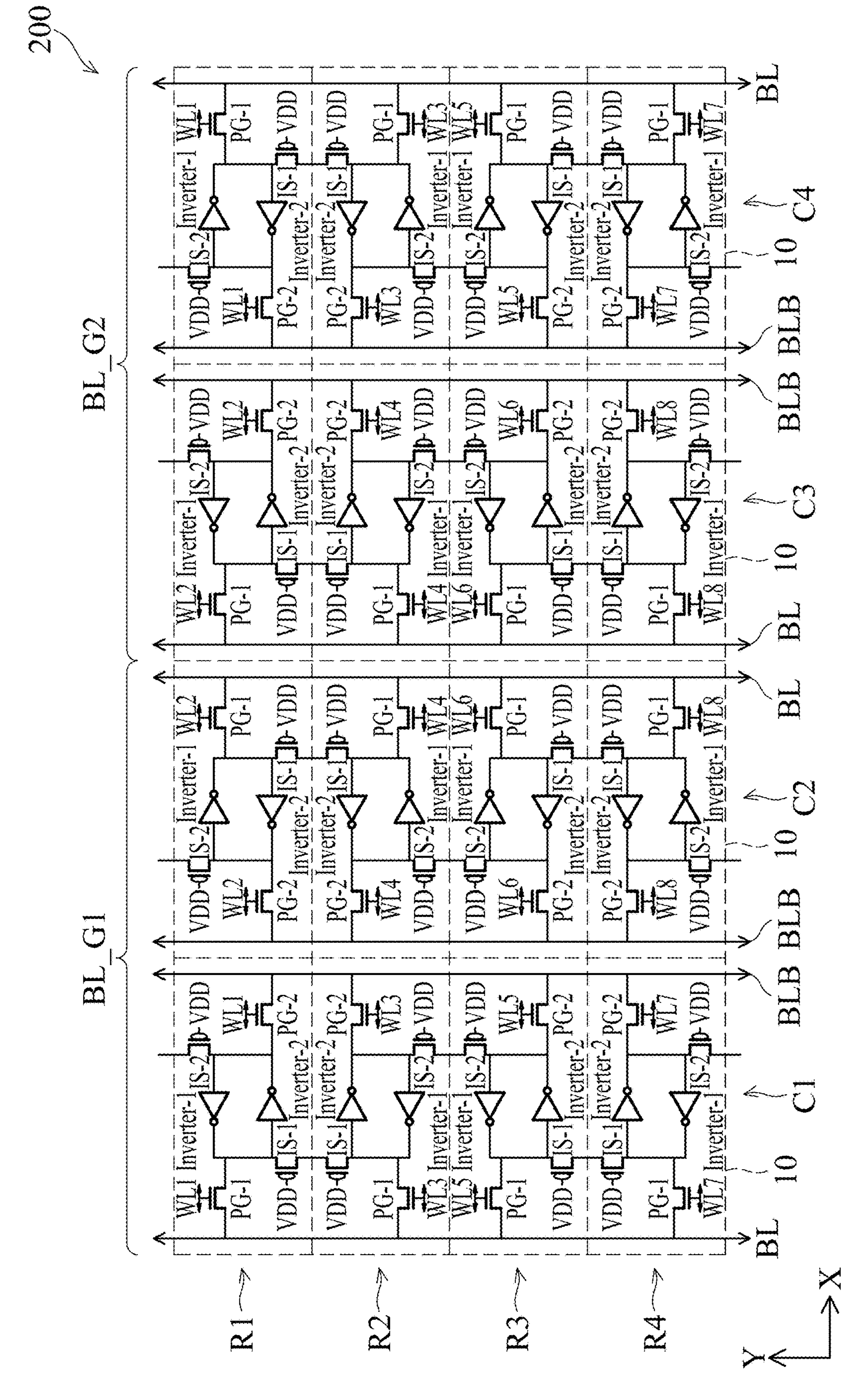
FIG. 13 shows a memory array, in accordance with some embodiments of the disclosure.

FIG. 13 shows a memory array 200, in accordance with some embodiments of the disclosure. The memory array 200 is formed by multiple memory cells 10. In FIG. 13, the memory array 200 includes fourth rows R1 through R4 and fourth columns C1 through C4. Furthermore, the fourth columns C1 through C4 are divided into the groups BL_G1 and BL_G2. For example, the group BL_G1 includes the columns C1 and C2, and the group BL_G2 includes the columns C3 and C4. Each of the rows R1 through R4 in the groups BL_G1 and BL_G2 includes two memory cells, which include two cells that are mirror images of one another with respect to a center line extending along the Y direction. Each memory cell includes a pair of the bit line BL and the complementary bit line BLB. Therefore, in each of the rows R1 through R4 of the groups BL_G1 and BL_G2, the two memory cells includes two bit lines BL and two complementary bit lines BLB that extend along the Y direction. In some embodiments, the active regions in each of the columns C1 through C4 are continuous active regions.

In various embodiments, the row in the cell array 200 may include more memory cells 10 or fewer memory cells 10 than the layout shown in FIG. 13. In various embodiments, the cell array 200 may include more rows or fewer rows and more columns or fewer columns than the layout shown in FIG. 13. Furthermore, the memory cells 10 of the cell array 200 have the similar configuration in layout. Moreover, the memory cells 10 in each row of the groups BL_G1 and BL_G2 may be the memory cells 10*a*_1 and 10*a*_2 of FIGS. 3A through 3C, the memory cells 10*b*_1 and 10*b*_2 of FIG. 5, the memory cells 10*c*_1 and 10*c*_2 of FIGS. 6A through 6C, the memory cells 10*d*_1 and 10*d*_2 of FIG. 8, the memory cells 10*e*_1 and 10*e*_2 of FIG. 9, and the memory cells 10*f*_1 and 10*f*_2 of FIGS. 11A through 11C.

In the memory array 200, the memory cells 10 in adjacent rows are mirror images of one another with respect to a center line extending along the X direction. For example, the memory cells 10 in the row R2 of the groups BL_G1 are a mirror image of the memory cells 10 in the row R1 of the groups BL_G1 with respect to the interface between the rows R1 and R2. Similarly, the memory cells 10 in the row R2 of the group BL_G1 are a mirror image of the memory cells 10 in the row R3 of the groups BL_G1 with respect to the interface between the rows R2 and R3.

In the memory array 200, the memory cells 10 in adjacent groups are mirror images of one another with respect to a center line extending along the T direction. For example, the memory cells 10 in the column C2 of the groups BL_G1 are a mirror image of the memory cells 10 in the column C3 of the groups BL_G2 with respect to the interface between groups BL_G1 and BL_G2 (i.e., the interface between columns C2 and C3). Similarly, the memory cells 10 in the column C1 of the group BL_G1 are a mirror image of the memory cells 10 in the column C4 of the groups BL_G2 with respect to the interface between groups BL_G1 and BL_G2.

As described above, the two adjacent cells are accessed by different word lines WL. For example, in the row R1 of the group BL_G1, the memory cell 10 on the left is accessed by a word line WL1 and the memory cell 10 on the right is accessed by a word line WL2. In the row R2 of the group BL_G1, the memory cell 10 on the left is accessed by a word line WL3 and the memory cell 10 on the right is accessed by a word line WL4. In the row R3 of the group BL_G1, the memory cell 10 on the left is accessed by a word line WL5 and the memory cell 10 on the right is accessed by a word line WL6. In the row R4 of the group BL_G1, the memory cell 10 on the left is accessed by a word line WL7 and the memory cell 10 on the right is accessed by a word line WL8.

Similarly, in the row R1 of the group BL_G2, the memory cell 10 on the left is accessed by the word line WL2 and the memory cell 10 on the right is accessed by the word line WL1. In the row R2 of the group BL_G2, the memory cell 10 on the left is accessed by the word line WL4 and the memory cell 10 on the right is accessed by the word line WL3. In the row R3 of the group BL_G2, the memory cell 10 on the left is accessed by the word line WL6 and the memory cell 10 on the right is accessed by the word line WL5. In the row R4 of the group BL_G2, the memory cell 10 on the left is accessed by the word line WL8 and the memory cell 10 on the right is accessed by the word line WL7.

Figure 14A:
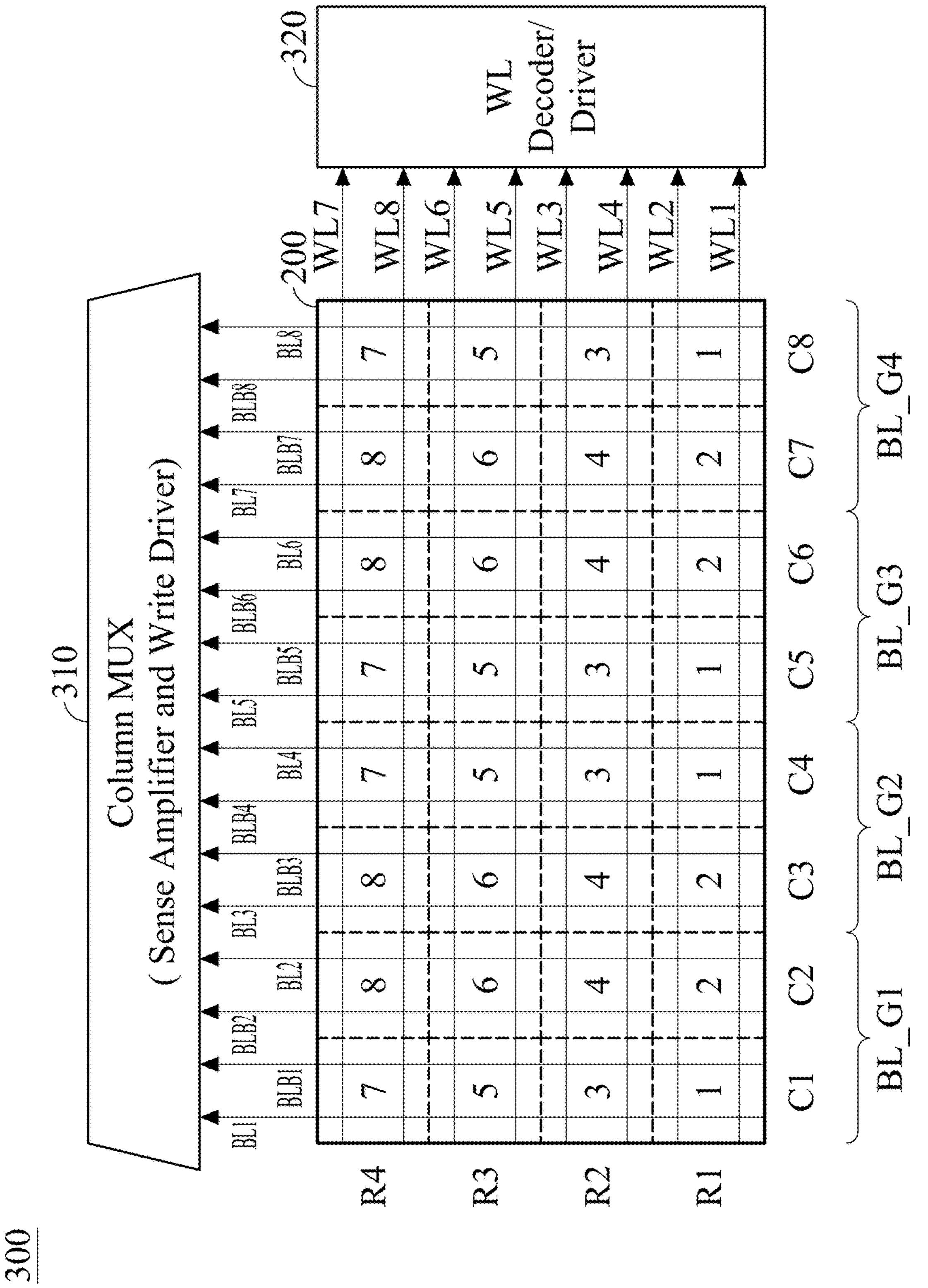
FIG. 14A and FIG. 14B show a memory device, in accordance with some embodiments of the disclosure.
Figure 14B:
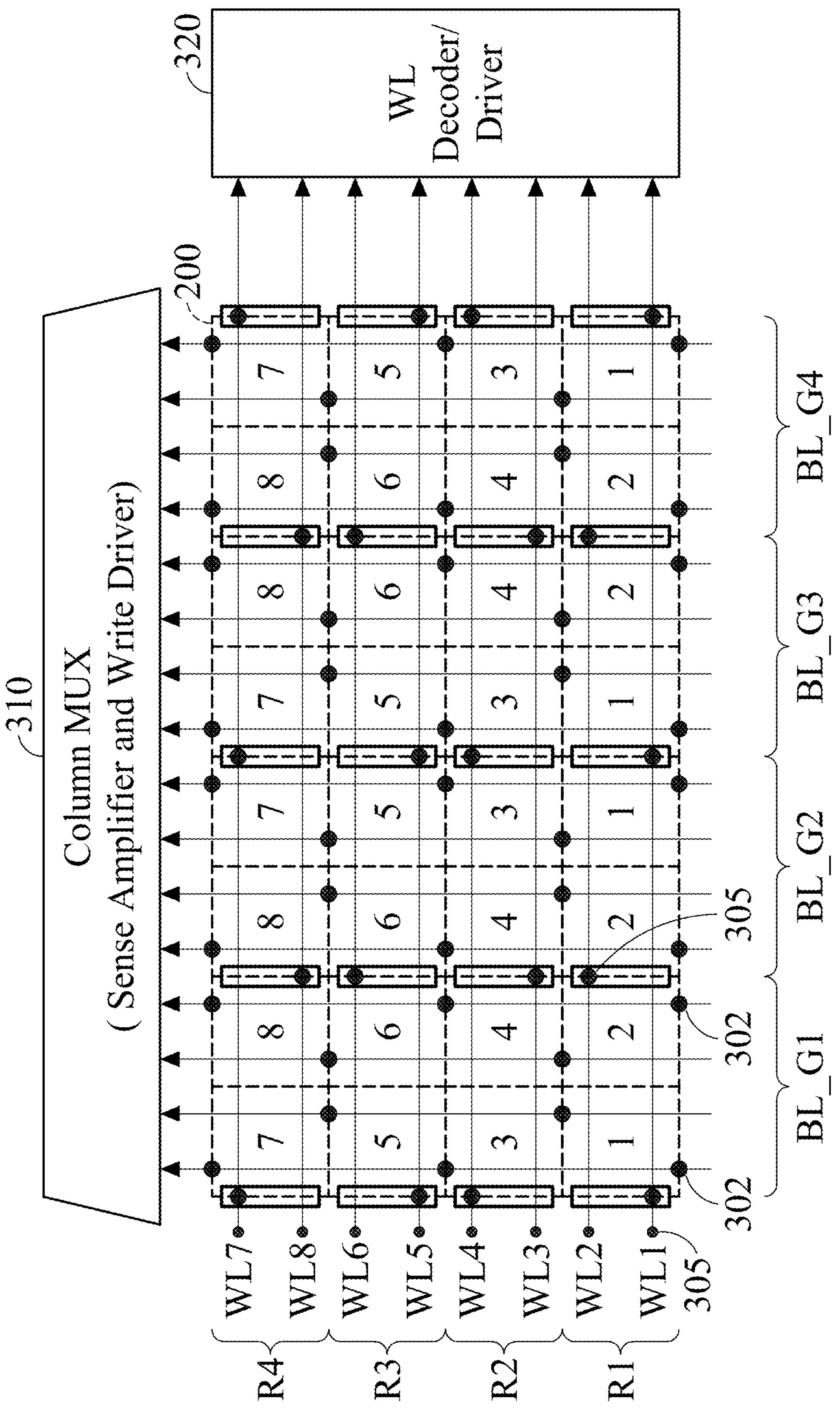

FIG. 14A and FIG. 14B show a memory device 300, in accordance with some embodiments of the disclosure. The memory device 300 may be implemented in an IC. The memory device 300 includes a memory array 200, a column multiplexer 310 and a word line (WL) decoder/driver 320. In this embodiment, the memory array 200 includes the memory cells arranged in the rows R1 through R4 and the columns C1 through C8.

Each of the rows R1 through R4 is spanned over along the X direction by two word lines WL. In this embodiment, the memory cells 10 in the row R1 are accessed by the word lines WL1 and WL2. The memory cells 10 in the row R2 are accessed by the word lines WL3 and WL4. The memory cells 10 in the row R3 are accessed by the word lines WL5 and WL6. The memory cells 10 in the row R4 are accessed by the word lines WL7 and WL8. In order to simplify the description, the number labeled on the memory cell indicates that it is accessed by the corresponding word line WL. For example, the memory cells 10 labeled "1" in the row R1 are accessed by the word line WL1, and the memory cells 10 labeled "2" in the row R1 are accessed by the word line WL2. All of the word lines WL1 through WL8 extend along the X direction to couple to the WL decoder/driver 320, and the WL decoder/driver 320 is configured to decode or drive the memory cells 10.

The bit lines BL1 through BL8 and the complementary bit lines BLB1 through BLB8 are coupled to the column multiplexer (MUX) 310. The column MUX 310 also includes or is connected to a sense amplifier that is configured to sense and amplify data stored in the memory cells 10. The column MUX 310 may also include or be coupled to a write driver that is configured to write data into the memory cells 10.

In FIGS. 14A and 14B, the memory device 300 includes the columns C1 through C8 and 4 rows R1 through R4. Each of the columns C1 through C8 is coupled to a pair of the bit line BL and the complementary bit line BLB and, and each of the rows R1 through R4 is accessed by two word lines WL. In this embodiment, each memory cell 10 is configured to store a bit of data. Compared to a traditional memory device formed with 8T SRAM cells or 6T SRAM cells, the memory device 300 includes twice as many bit lines. In other words, the number of memory cells connected to each bit line BL is decreased, thereby reducing the resistor-capacitor (RC) value of the bit line BL.

The columns C1 through C8 are divided into the groups BL_G1 through BL_G4. The memory cells in each of the columns C1 through C8 is accessed by a bit line BL and a complementary bit line BLB. Each of the groups BL_G1 through BL_G4 includes two bit lines BL and two complementary bit lines BLB. In FIG. 14B, the node 302 represents that the bit line BL or the complementary bit line BLB is electrically connected to the corresponding memory cell 10. Furthermore, each of the rows R1 through R4 is accessed by two word lines WL, and each word line WL is electrically connected to a landing pad between the interface of two adjacent groups, as shown in the node 305.

Embodiments of semiconductor devices are provided. The semiconductor devices include the single-port memory cells arranged in a memory array. In each memory cell, the P-type transistors share at least one first active region, and the N-type transistors share at least one second active region. In each row of the memory array, two different word lines are parallel to each other and extend across each cell. The memory cells in the same row are divided into multiple groups, and each group includes two adjacent memory cells. In each group, the two adjacent memory cells are accessed by the two different word lines, respectively. According to the word line routing scheme, RC delay improvement is obtained due to the reduction of the number of memory cells in the same column of each group.

In some embodiments, a semiconductor device is provided. The semiconductor device includes a first memory cell and a second memory cell. The first memory cell includes a first pull-down transistor and a first pass-gate transistor formed over a first P-type well region in a substrate; and a first pull-up transistor and a first isolation transistor formed over an N-type well region in the substrate. The second memory cell includes a second pull-down transistor and a second pass-gate transistor formed over a second P-type well region in the substrate; and a second pull-up transistor and a second isolation transistor formed over the N-type well region in the substrate. The first and second isolation transistors share a common gate extending in a first direction, and wherein the common gate is electrically connected to a VDD line extending in a second direction that is perpendicular to the first direction. The gates of the first and second pass-gate transistors are electrically connected to a first word line (WL) landing pad and a second WL landing pad, respectively. The sources of the first and second pass-gate transistors are electrically connected to a first bit line and a second bit line extending in the second direction, respectively. The VDD line, the first WL landing pad, the second WL landing pad, the first bit line and the second bit line are formed in a first metal layer, and the first and second bit lines and the VDD line are longer than the first and second WL landing pads in the second direction.

In some embodiments, a semiconductor device is provided. The semiconductor device includes a memory cell. The memory cell includes a first pull-down transistor, a second pull-down transistor, a first pass-gate transistor, and a second pass-gate transistor formed over a P-type well region in a substrate; and a first pull-up transistor and a first isolation transistor formed over an N-type well region in the substrate. The gate of the first isolation transistor is electrically connected to a VDD line extending in a first direction, and the gate of the first pass-gate transistor is electrically connected to a word line (WL) landing pad. The source of the first pass-gate transistor is electrically connected to a first bit line extending in the first direction through a first bit line landing pad and a second bit line landing pad. The source of the second pass-gate transistor is electrically connected to a second bit line extending in the first direction, wherein the first bit line landing pad is disposed between the second bit line and the WL landing pad. The first and second bit lines are wider than the VDD line and the WL landing pad.

In some embodiments, a semiconductor device is provided. The semiconductor device includes a first memory cell and a second memory cell. The second memory cell is adjacent to the first memory cell, and the two are in contact. The first memory cell includes a first pull-down transistor and a first pass-gate transistor formed over a first P-type well region in a substrate; and a first pull-up transistor and a first isolation transistor formed over an N-type well region in the substrate. The second memory cell includes a second pull-down transistor and a second pass-gate transistor formed over a second P-type well region in a substrate; and a second pull-up transistor and a second isolation transistor formed over the N-type well region. The N-type well region is disposed between the first and second P-type well regions. The first pull-down transistor and the first pull-up transistor share a first gate structure extending in a first direction in the first memory cell, and the second pull-down transistor and the second pull-up transistor share a second gate structure extending in the first direction in the second memory cell. A gate of the second pass-gate transistor is electrically connected to a first word line landing pad extending in a second direction, and the first word line landing pad is electrically connected to a first word line extending in the first direction. The first word line overlaps the first gate structure and the second gate structure. The first isolation transistor of the first memory cell and the second isolation transistor of the second memory cell share a third gate structure. The third gate structure is electrically connected to a VDD line extending in the second direction, and the VDD line is disposed between the first and second gate structures, wherein the first direction is perpendicular to the second direction.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first memory cell, comprising:

a first pull-down transistor and a first pass-gate transistor formed over a first P-type well region in a substrate; and a first pull-up transistor and a first isolation transistor formed over an N-type well region in the substrate; and a second memory cell, comprising:

a second pull-down transistor and a second pass-gate transistor formed over a second P-type well region in the substrate; and a second pull-up transistor and a second isolation transistor formed over the N-type well region in the substrate, wherein the first and second isolation transistors share a common gate extending in a first direction, and wherein the common gate is electrically connected to a VDD line extending in a second direction that is perpendicular to the first direction, wherein gates of the first and second pass-gate transistors are electrically connected to a first word line (WL) landing pad and a second WL landing pad, respectively, wherein sources of the first and second pass-gate transistors are electrically connected to a first bit line and a second bit line extending in the second direction, respectively, and wherein the VDD line, the first WL landing pad, the second WL landing pad, the first bit line and the second bit line are formed in a first metal layer, and the first and second bit lines and the VDD line are longer than the first and second WL landing pads in the second direction.

2. The semiconductor device as claimed in claim 1, wherein the VDD line is disposed at a first cell boundary shared by the first and second memory cells, the first WL landing pad is disposed at a second cell boundary of the first memory cell that is opposite the first cell boundary, and the second WL landing pad is disposed at a third cell boundary of the second memory cell that is opposite the first cell boundary.

3. The semiconductor device as claimed in claim 1, wherein sources of the first and second pull-down transistors are electrically connected to a first VSS landing pad and a second VSS landing pad extending in the second direction, respectively.

4. The semiconductor device as claimed in claim 3, wherein the first and second VSS landing pads are electrically connected to a VSS line extending in the first direction, and wherein the VSS line is formed in a second metal layer that is over the first metal layer.

5. The semiconductor device as claimed in claim 4, wherein each of the first and second bit lines has at least one extra portion, wherein the extra portion of the first bit line face the extra portion of the second bit line, and wherein the extra portions are disposed on boundaries of the first and second memory cells.

6. The semiconductor device as claimed in claim 1, wherein the first pull-down transistor and the first pass-gate transistor share a first active region, the first pull-up transistor and the first isolation transistor share a second active region, the second pull-down transistor and the second pass-gate transistor share a third active region, and the second pull-up transistor and the second isolation transistor share a fourth active region.

7. The semiconductor device as claimed in claim 6, wherein the first active region is formed by a plurality of first vertically stacked nanostructures, the second active region is formed by a plurality of second vertically stacked nanostructures, the third active region is formed by a plurality of third vertically stacked nanostructures, and the fourth active region is formed by a plurality of fourth vertically stacked nanostructures, wherein each of the first and third vertically stacked nanostructures has a first width along the first direction, and each of the second and fourth vertically stacked nanostructures has a second width along the first direction, wherein the first width is greater than the second width.

8. A semiconductor device, comprising:

a first active region extending along a first direction and over a P-type well region in a substrate;

a second active region extending along the first direction and over an N-type well region in the substrate;

a first gate structure extending along a second direction and engaging the first active region to form a first transistor;

a second gate structure extending along the second direction and engaging the first active region and the second active region to form a second transistor and a third transistor, respectively;

a third gate structure extending along the second direction and engaging the first active region and the second active region to form a fourth transistor and a fifth transistor, respectively;

a fourth gate structure extending along the second direction and engaging the first active region to form a sixth transistor; and a fifth gate structure extending along the second direction and engaging the second active region to form a seventh transistor, wherein the fifth gate structure is electrically connected to a first power line extending in the first direction, and the first gate structure is electrically connected to a first metal line landing pad, wherein a source of the first transistor is electrically connected to a second metal line extending in the first direction through a second metal line landing pad and a third metal line landing pad, wherein a source of the sixth transistor is electrically connected to a third metal line extending in the first direction, wherein the second metal line landing pad is disposed between the third metal line and the first metal line landing pad along the second direction, and wherein the second and third metal lines are wider than the first power line and the first metal line landing pad.

9. The semiconductor device as claimed in claim 8, wherein the third metal line is disposed over the P-type well region and the N-type well region, and the third metal line extends along an interface between the N-type well region and the P-type well region.

10. The semiconductor device as claimed in claim 8, wherein the first power line, the first metal line landing pad, the second metal line landing pad, and the third metal line is formed in a first metal layer, wherein the third metal line landing pad is formed in a second metal layer over the first metal layer, and wherein the second metal line is formed in a third metal layer over the second metal layer.

11. The semiconductor device as claimed in claim 8, further comprising:

a sixth gate structure extending along the second direction and engaging the second active region to form an eighth transistor, wherein the second and fourth transistors are disposed between the first and sixth transistors, and the third and fifth transistors are disposed between the seventh and eighth transistors.

12. The semiconductor device as claimed in claim 8, wherein sources of the second and fourth transistors are electrically connected to a second power line extending in the first direction, wherein the second power line is disposed between the second metal line landing pad and the first metal line landing pad.

13. The semiconductor device as claimed in claim 12, wherein the second metal line landing pad is disposed between the third metal line and the second power line.

14. A semiconductor device, comprising:

a first cell, comprising:

a first active region extending along a first direction and over a first P-type well region in a substrate;

a second active region extending along the first direction and over an N-type well region in the substrate;

a first gate structure extending along a second direction and engaging the first active region;

a second gate structure extending along the second direction and engaging the first active region and the second active region, such that the second gate structure is shared by the first active region and the second active region; and a first portion of a third gate structure engaging the second active region, wherein the third gate structure extends along the second direction; and a second cell adjacent to and in contact with the first cell, comprising:

a third active region extending in the first direction and formed over a second P-type well region in the substrate;

a fourth active region extending in the first direction formed over the N-type well region, wherein the N-type well region is disposed between the first and second P-type well regions;

a fourth gate structure extending along the second direction and engaging the third active region;

a fifth gate structure extending along the second direction and engaging the third active region and the fourth active region, such that the fifth gate structure is shared by the third active region and the fourth active region; and a second portion of the third gate structure engaging the fourth active region, such that the third gate structure is shared by the second active region and the fourth active region, wherein the fourth gate structure is electrically connected to a first metal line landing pad extending in the first direction, and the first metal line landing pad is electrically connected to a first metal line extending in the second direction, wherein the first metal line overlaps the second gate structure and the fifth gate structure, and wherein the third gate structure is electrically connected to a first power line extending in the first direction, and the first power line is disposed between the second gate structure and the fifth gate structure, wherein the first direction is perpendicular to the second direction.

15. The semiconductor device as claimed in claim 14, wherein the first gate structure is electrically connected to a second metal line landing pad extending in the first direction, and the second metal line landing pad is electrically connected to a second metal line extending in the second direction.

16. The semiconductor device as claimed in claim 15, wherein the first cell further comprises:

a sixth gate structure extending along the second direction and engaging the first active region and the second active region, such that the sixth gate structure is shared by the first active region and the second active region; and a seventh gate structure extending along the second direction and engaging the first active region, wherein the second cell further comprises:

an eighth gate structure extending along the second direction and engaging the third active region and the fourth active region, such that the eighth gate structure is shared by the third active region and the fourth active region; and a ninth gate structure extending along the second direction and engaging the third active region, and wherein the second metal line overlaps the sixth gate structure and the eighth gate structure.

17. The semiconductor device as claimed in claim 16, wherein the second gate structure and the first active region form a first transistor and the sixth gate structure and the first active region form a second transistor, wherein the fifth gate structure and the third active region form a third transistor and the eighth gate structure and the third active region form a fourth transistor, wherein sources of the first transistor and the second transistor are electrically connected to a first power line landing pad, and sources of the third transistor and the fourth transistor are electrically connected to a second power line landing pad, and wherein the first and second power line landing pads are electrically connected to a second power line extending in the second direction.

18. The semiconductor device as claimed in claim 17, wherein the first metal line, the second metal line, and the second power line are parallel to each other, and wherein the second power line is disposed between the first metal line and the second metal line.

19. The semiconductor device as claimed in claim 16, wherein the first cell further comprises a third portion of a tenth gate structure engaging the second active region, wherein the tenth gate structure extends along the second direction, and wherein the second cell further comprises a fourth portion of the tenth gate structure engaging the fourth active region, such that the tenth gate structure is shared by the second active region and the fourth active region.

20. The semiconductor device as claimed in claim 19, wherein the tenth gate structure is electrically connected to the first power line, and the first power line is disposed between the sixth gate structure and the eighth gate structure.

* * * * *